United States Patent
Cabrera

(10) Patent No.: US 11,200,262 B2
(45) Date of Patent: Dec. 14, 2021

(54) SYSTEMS AND METHODS OF MAPPING, TRANSFORMING, AND SHARING DATA AND IDEAS

(71) Applicant: Plectica LLC, New York, NY (US)

(72) Inventor: Derek Cabrera, Ithaca, NY (US)

(73) Assignee: Frameable Inc., Washington, DC (US)

( * ) Notice: Subject to any disclaimer, the term of this patent is extended or adjusted under 35 U.S.C. 154(b) by 76 days.

(21) Appl. No.: 16/157,143

(22) Filed: Oct. 11, 2018

(65) Prior Publication Data

US 2019/0114355 A1 Apr. 18, 2019

Related U.S. Application Data

(60) Provisional application No. 62/571,300, filed on Oct. 12, 2017.

(51) Int. Cl.
*G06F 16/28* (2019.01)
*H01L 21/683* (2006.01)
(Continued)

(52) U.S. Cl.
CPC .......... *G06F 16/288* (2019.01); *G06F 16/176* (2019.01); *G06F 16/258* (2019.01);
(Continued)

(58) Field of Classification Search
CPC ...... G06F 16/288; G06F 16/26; G06F 16/176; G06F 16/258; H01L 21/683; H01L 21/68714
See application file for complete search history.

(56) References Cited

U.S. PATENT DOCUMENTS 6,772,167 B1 * 8/2004 Snavely ............... G06F 21/6227
7,100,195 B1 * 8/2006 Underwood ............ G06F 9/451
726/2
(Continued)

OTHER PUBLICATIONS

International Search Report and Written Opinion dated Jan. 8, 2019 in related International Application No. PCT/US2018/055330.
(Continued)

*Primary Examiner* — Alford W Kindred
*Assistant Examiner* — Lin Lin M Htay
(74) *Attorney, Agent, or Firm* — Eric L. Lane; Green Patent Law

(57) ABSTRACT

Systems and methods of manipulating and transforming data and sharing ideas include a map comprised of one or more diocards. Each diocard represents an individual idea and has the same group of functions including a distinctions function, a systems function, a relationships function, and a perspectives function. The distinctions function enables definition of the individual idea by attributes the individual idea is comprised of and by non-attributes the individual idea is not comprised of. The systems function enables definition of the individual idea as part of a whole or a whole that can be broken into parts. The relationships function enables definition of the individual idea as having a relationship with one or more different ideas and that this relationship may include action and reaction-like properties. The perspectives function enables definition of the individual idea as a point having a view with respect to one or more different ideas.

12 Claims, 18 Drawing Sheets

(51) Int. Cl.
*H01L 21/687* (2006.01)
*G06F 16/26* (2019.01)
*G06F 16/176* (2019.01)
*G06F 16/25* (2019.01)

(52) U.S. Cl.
CPC ............ *G06F 16/26* (2019.01); *H01L 21/683* (2013.01); *H01L 21/68714* (2013.01)

(56) References Cited

U.S. PATENT DOCUMENTS

| | | | |
|---|---|---|---|
| 8,075,314 B2 | 12/2011 | Cabrera | |
| 9,372,889 B1* | 6/2016 | Jakobsson | G06F 16/24542 |
| 2002/0010700 A1 | 1/2002 | Wotring et al. | |
| 2006/0121436 A1 | 6/2006 | Kruse et al. | |
| 2009/0138315 A1* | 5/2009 | Schroeder | G06Q 10/06 705/12 |
| 2009/0157801 A1* | 6/2009 | Barber | G06F 16/904 709/203 |
| 2009/0192980 A1* | 7/2009 | Beyer | G06F 16/2462 |
| 2009/0282369 A1* | 11/2009 | Jones | G06F 16/26 715/848 |
| 2011/0213750 A1 | 9/2011 | Kumar et al. | |
| 2012/0077180 A1 | 3/2012 | Sohmshetty et al. | |
| 2012/0324347 A1* | 12/2012 | Monroe | G06F 17/2785 715/255 |
| 2013/0073389 A1* | 3/2013 | Heath | G06Q 50/01 705/14.54 |
| 2014/0075004 A1* | 3/2014 | Van Dusen | H04L 41/04 709/223 |
| 2014/0172864 A1* | 6/2014 | Shum | G06F 19/00 707/740 |

OTHER PUBLICATIONS

Wang et al., "A general model transformation methodology to serve enterprise interoperability sharing problem" Int'l IFIP Working Conf on Enterprise Op, May 20, 2015.

ThinkQuiry web page, www.thinkquiry.us.

Derek Cabrera, 3 Simple Tips to Learning DSRP, Systems Thinking Daily Blog, May 5, 2016, https://stdaily.ghost.io/the-1-most-difficult-thing-to-understand-about-dsrp-2/.

Derek Cabrera, 7 Tricks to Making Better Distinctions, Systems Thinking Daily Blog, Feb. 5, 2016, https://stdaily.ghost.io/distinctions-2/.

Derek Cabrera, Recognizing Relationships, Systems Thinking Daily Blog, Feb. 5, 2016, https://stdaily.ghost.io/recognizing-relationships/.

DSRP: Four Simple Rules of Systems Thinking, Think Water, https://www.thinkwater.us/.

Cabrera Research Lab web sites, https://www.crlab.us/.

Thinkblocks, https://en.wikipedia.org/wiki/ThinkBlocks.

Derek Cabrera, How Thinking Works, Tedx, Dec. 6, 2011, https://www.youtube.com/watch?v=dUqRTWCdXt4.

Derek Cabrera & Laura Cabrera, Systems Thinking Made Simple: New Hope for Solving Wicked Problems, Odyssean Press (2015) (Excerpt).

MetaMap Software representation screen shots (2014).

Derek Cabrera et al., A Protocol of Systems Evaluation, Cornell Systems Evaluation Series, May 30, 2006.

Dr. Cabrera's 2015 ISSS Plenary Talk: In Search of Universality in Systems Thinking, STDaily Blog, Jul. 28, 2014, https://stdaily.ghost.io/dr-cabreras-2015-isss-plenary-talk/.

A Primer on the Four Simple Rules of Systems Thinking, STDaily Blog, Jul. 23, 2015, https://stdaily.ghost.io/dd/.

Derek Cabrera, Ted Talk, A Big TOE (Theory of Everything), Dec. 10, 2012, https://www.youtube.com/watch?v=farhdoG5Y6c.

Derek Cabrera, The Four Simple Rules of Systems Thinking, https://www.youtube.com/watch?v=PgyDEHT82DQ.

Derek Cabrera and Laura Cabrera, 2016 Cornell University Systems Thinking Symposium, https://www.youtube.com/playlist?list=PLJYST9b0XMPtzqRXKoYYoENVmQqyXpMx4.

The Power of Perspective Poster.

Distinctions, System, Relationships, Perspective poster.

Derek Cabrera et al., A Unifying Theory of Systems Thinking with Psychosocial Applications, Systems Research and Behavioral Science (2015).

Derek Cabrera et al., Systems thinking, Evaluation and Program Planning 31 (2008) 299-310.

Derek Cabrera, Boundary Critique: A Minimal Concept Theory of Systems Thinking, (2006) in Proceedings of the 50th Annual Meeting of the Int'l Society of Systems Science.

Derek Cabrera, Systems Thinking (Doctoral Dissertation) (May 2006).

* cited by examiner

SYSTEMS AND METHODS OF MAPPING, TRANSFORMING, AND SHARING DATA AND IDEAS

CROSS-REFERENCE TO RELATED APPLICATION

This application claims priority to and benefit of U.S. Patent Application No. 62/571,300, filed Oct. 12, 2017, which is hereby incorporated by reference in its entirety.

FIELD OF THE DISCLOSURE

The present disclosure relates to systems and methods of mapping, manipulating, transforming and sharing data and ideas and, in particular, to visual mapping tools for organizing and explaining complex information.

BACKGROUND

There are complex problems at all levels of society, from individuals to institutions and from local communities handling local problems to the international community dealing with global issues. Problems, however, are not divorced from the way people think about them. In fact, thinking styles can lead to or perpetuate problems. For example, some people are overly focused on the parts (reductionism) to the exclusion of the whole (holism). Some thinking styles are excessively hierarchical to the exclusion of more complex, distributed networks. Other unhelpful thinking styles include over-reliance on static categories, overly linear and causal thinking, bias toward seeing only structural parts, and binary thinking. We must change our thinking from the binary, linear, and categorical kind to a new form of thinking called systems thinking to solve our individual and local problems as well as the major issues facing humanity.

The field of systems thinking provides hope that individuals can gain personal mastery over both everyday and highly complex problems and can come together to better understand the world as a whole as solve or most wicked problems. However, many years of systems thinking research has given rise to many different methodologies. To make sense of this, we need systems and methods that break down systems thinking to its bare essentials.

It is a common aspiration in machine learning applications to take media input (audio, video, images, text) and "learn" a distilled abstract vector representation—a finite sequence of numbers representing a point in high-dimensional space, in which quantitatively near-by vectors represent proportionally similar input, and vice versa. In the case of images, for example this may allow us to "recognize" stop lights for example, given a still from a dash cam of a self-driving car, since the vector produced for that still is closely aligned with vectors produced from other images of stop lights.

A common problem with this approach, however, is that with most traditional media, the semantic structure of the content is only implied, not explicit in the medium itself, and so learning requires extremely large amounts of input corpora, and there is a built-in ceiling on the complexity of the learned semantic content. When humans see an image, we do more than just recognize the objects—we attempt to understand the context of the situation by relating it to our past. We infer the relationships of objects using information we have accumulated through experience, and so most of the information required to understand the contents of the image often is not actually in the image, but in us.

Another problem is the common misconception is that thinking is a pre-activity to doing or action. But thinking (aka, "cognition") is not only an act itself and not only can occur prior to or post action(s), it is also inherent to action itself and therefore can and does occur during the taking of action. This is increasingly important as new software is governing everything from tasks to problem solving. Embedded in these processes, must be thinking. Also, thinking is deeply related to the creation of knowledge itself. The act of thinking leads to the creation of knowledge. Where knowledge management is concerned, the thinking that is being done is not "rolling up" into the knowledge that exists (in an individual or collective knowledge base). Often the act of knowledge capture is separate from the act of thinking and creation. It is therefore imperative that the act of thinking and solving problems directly yields the "base of knowledge" or knowledgebase.

Thus, there is a need for an accessible set of modeling and visualization tools that allows individuals to change the way they think, act, and create knowledge. There is also a need for a mapping tool that allows individuals and institutions to implement the essential rules of systems thinking. A need also exists for a data transformation and mapping tool that allows sharing and modification of ideas. There is also a need for a mapping tool incorporating machine learning processes with an explicit semantic structure.

SUMMARY

The present disclosure, in its many embodiments, alleviates to a great extent the disadvantages of known systems thinking methodologies and data modeling solutions by providing systems and methods of manipulating, transforming and sharing data and ideas in which one or more diocards can be used to create a map, and each diocard represents an individual idea and has the same group of functions including a distinctions function, a systems function, a relationships function, and a perspectives function. The present disclosure comprises a visual mapping tool that helps individuals and teams organize, explain, and collaborate on complex information. Based on years of applied research on how people think and learn, exemplary embodiments work the way the human brain does: by organizing parts that can be combined and connected to each other to form a complete picture. Whether users are diagramming an internal system, brainstorming new products, or onboarding new team members to key organizational practices, exemplary embodiments help make things crystal clear.

Exemplary embodiments, with unique DSRP architecture, can create a "cognitive engine" for driving any number of uses such as task or team-based activities. In addition, in exemplary embodiments, the act of thinking and solving problems directly yields the "base of knowledge" or knowledgebase. This is significantly different from existing "knowledge base" activities and applications where individual thinkers, need to consult the knowledge base, find a stale and curated knowledgebase rather than a fluid and up-to-date. There is also far less "load" on the system as it is operating as an efficient ecology of information and knowledge, where the local individual behavior of the thinking agents leads to the collective dynamics that make knowledge an emergent property of the system itself.

Exemplary embodiments of a system of manipulating and transforming data comprise one or more diocards and a map comprised of the one or more diocards. Each diocard represents an individual idea and has the same group of functions including a distinctions function, a systems function, a relationships function, and a perspectives function. The four functions can organize any type of data, including words, images, videos, etc., but also to include mathematical equations and variables. The distinctions function enables definition of the individual idea by attributes the individual idea is comprised of and by non-attributes the individual idea is not comprised of, thereby creating libraries of interconnected ideas that range from near-exact synonyms to near-far synonyms, to antonyms to totally unrelated concepts. The systems function enables definition of the individual idea as part of a whole or a whole that can be broken into parts. The relationships function enables definition of the individual idea as having a relationship with one or more different ideas and that this relationship may include action- and reaction-like properties. The perspectives function enables definition of the individual idea as a point having a view with respect to one or more different ideas.

The functions play various roles and take different actions with the ideas, the diocards, and the maps. In exemplary embodiments, the distinctions function enables definition of a first individual idea represented by a first diocard as not being comprised of attributes of a second individual idea represented by a second diocard. In exemplary embodiments, the systems function enables users to break a parent diocard into one or more child diocards, the one or more child diocards being part of a whole represented by the parent diocard. The systems function also may enable users to group a plurality of child diocards into a group such that the plurality of diocards become parts of a whole represented by the group. In exemplary embodiments, the relationships function enables users to create a relational diocard representing the relationship between one or more diocards. The perspectives function may enable users to create a first diocard having a perspective with respect to one or more second diocards.

In exemplary embodiments, the systems function creates various layouts such that the one or more child diocards appear with the parent diocard. In exemplary embodiments, one of the diocards constitute an expandable map. One of the diocards may be a proxy for the map, and the map is comprised of a plurality of diocards. In exemplary embodiments, the map is scaled and nested to maintain readability and readability is preserved along with underlying cues to structure when zooming out. The map also may be compressible by collapsing the one or more diocards based on hierarchy and/or perspective. In exemplary embodiments, the map generates canonical suggestions in a diocard label field. In exemplary embodiments, one or more of the functions in the group of functions creates one or more meta-level structures for organizing the map or the one or more diocards into at least one macro-structure. In exemplary embodiments, one or more of the functions in the group of functions enables generation of one or more cognitive jigs. In exemplary embodiments, one or more of the functions in the group of functions synthesizes behavior of users to directly yield a knowledgebase.

Exemplary methods of collaboratively manipulating and sharing ideas comprise creating one or more diocards, creating a map comprised of the one or more diocards, and sharing between at least two users the individual idea, one or more diocards, the map, a template of the map, and/or a library of maps. Each diocard represents an individual idea and has the same group of functions including a distinctions function, a systems function, a relationships function, and a perspectives function. The distinctions function defines the individual idea by attributes the individual idea is comprised of and by non-attributes the individual idea is not comprised of. The systems function defines the individual idea as part of a whole or a whole that can be broken into parts. The relationships function defines the individual idea as having a relationship with one or more different ideas, and the perspectives function defines the individual idea as a point having a view with respect to one or more different ideas.

In exemplary sharing methods, the shared individual idea is modified by another user. Exemplary methods may further comprise tracking changes in shared ideas or shared maps. Individual ideas may be shared asymmetrically. In exemplary embodiments, the map generates canonical suggestions in a diocard label field based on canonical ideas from use of the map. Methods may further comprise designating one or more diocards as canonical and the ideas contained in the diocards as canonical ideas. The canonical ideas may be propagated and/or perturbed based on modifications to the shared individual ideas by users, the owner, or the administrator. Methods may also include propagating the authorship-path of canonical ideas based on forking the shared individual ideas, thereby allowing the canonical idea to become modified but part of an evolving chain. Exemplary embodiments include organizing one or more diocards as canonical into a shareable library. In exemplary embodiments, a user receives real-time analytical feedback based on information-content and cognitive structure, the feedback prompting the user to do one or more of: generate more diocards, organize the one or more diocards into part-whole groupings, relate the one more diocards, or utilize them in a perspectives function.

Accordingly, it is seen that systems, and methods of manipulating, organizing, transforming, and sharing data and ideas are provided. These and other features and advantages will be appreciated from review of the following detailed description, along with the accompanying figures in which like reference numbers refer to like parts throughout.

BRIEF DESCRIPTION OF THE DRAWINGS

The above-mentioned features and objects of the present disclosure will become more apparent with reference to the following description taken in conjunction with the accompanying drawings wherein like reference numerals denote like elements and in which.

DETAILED DESCRIPTION

Figure 1:
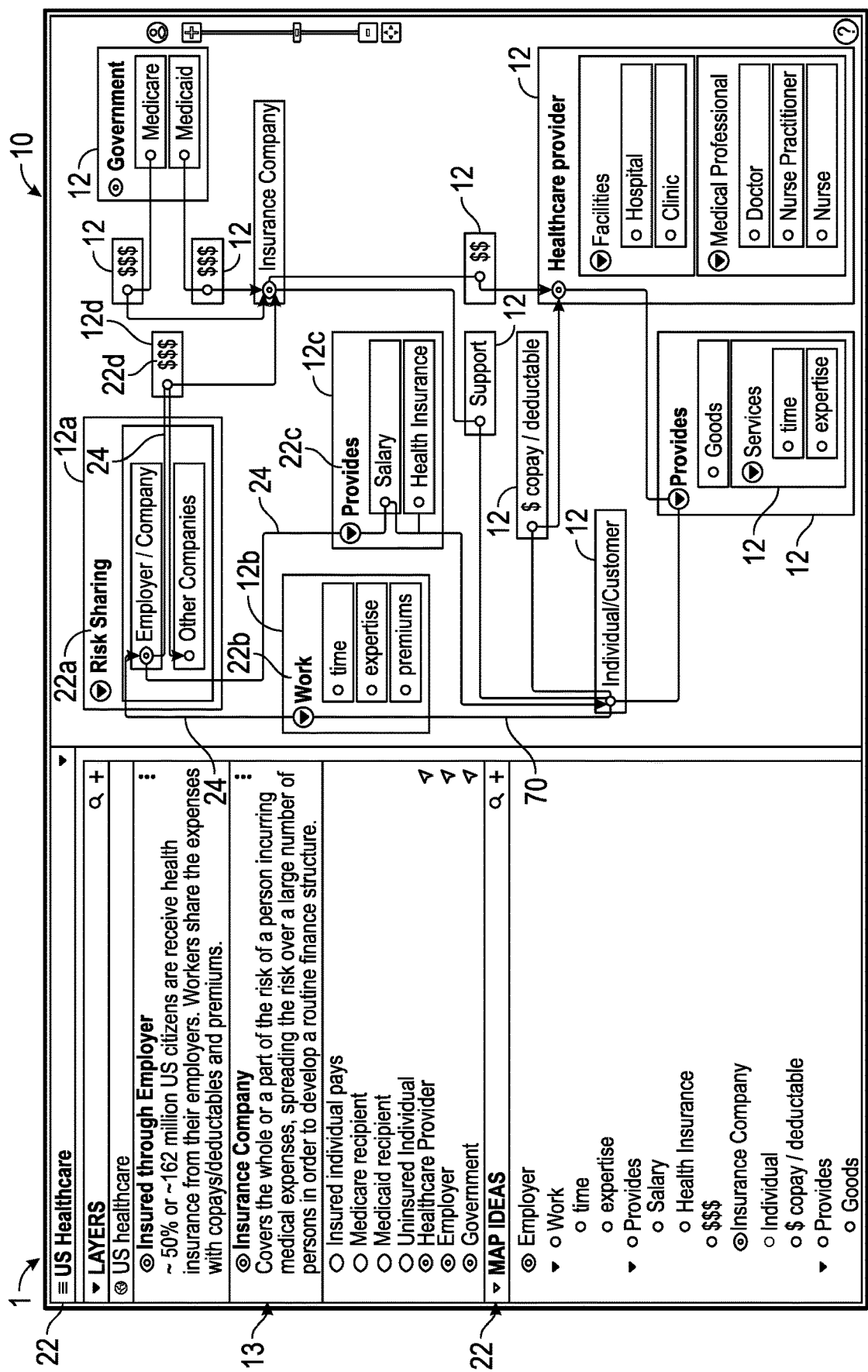
FIG. 1 is a schematic of an exemplary embodiment of a system and method of mapping, transforming, and sharing data showing perspectives functions in accordance with the present disclosure.

In the following detailed description of exemplary embodiments of the disclosure, reference is made to the accompanying drawings in which like references indicate similar elements, and in which is shown by way of illustration specific embodiments in which disclosed systems and devices may be practiced. These embodiments are described in sufficient detail to enable those skilled in the art to practice the embodiments, and it is to be understood that other embodiments may be utilized and that logical, mechanical, functional, and other changes may be made without departing from the scope of the present disclosure. The following detailed description is, therefore, not to be taken in a limiting sense, and the scope of the present disclosure is defined by the appended claims. As used in the present disclosure, the term "or" shall be understood to be defined as a logical disjunction and shall not indicate an exclusive disjunction.

FIGS. 1-4 illustrate exemplary embodiments of a system 1 of mapping, manipulating and transforming data. Generally, exemplary systems and methods take the form of a map 10 which is made up of one or more diocards 12. A "diocard" is a unique version of a card, an abstract term that refers to any object, which could be alternatively called a "node", a "brick", an "agent", a "note", an "element", a "sticky", an "idea", a "concept", a "thing", or by numerous other names. Disclosed systems and methods may be provided as software that does unique things with cards that other software doesn't do. More particularly, a "diocard" is the smallest effective element upon which the software is built, and each diocard 12 represents an individual idea 22 and has the same group of functions including a distinctions function 40, a systems function 50, a relationships function 60, and a perspectives function 70.

Sets of cards in a map may represent different classes of entities and so may have different applicable "roles." Applying a role to a card gives it a set of fields or "attributes" specific to that class of entity, allowing users to then specify particular values for those attributes for each card. For example, in a map about a company executing on an initiative, cards may represent teams, people, tasks, offices, etc. Cards representing people may have the "person" role applied, which will give the card attribute fields like "name", "email", "phone", and so on. Similarly, cards representing tasks may have the "task" role applied, which will give those cards relevant attributes like "due date", "development status", "completion date", and so on. A single card may have multiple roles. A card representing an employee may have the "person" role but may also have the "employee" role applied as well, which might add additional attributes such as "title" and "office location." Once multiple cards have the same role applied, we can search, filter and arrange positions based on the map based on the values of their attributes. We can also see a table-oriented layout of the cards on the map, with a row per card, and columns for each attribute.

Because the diocard 12 is the smallest effective element (as opposed to a map 10), exemplary embodiments are unique in that the user is creating diocards that can "live independent lives of their own" separate from the maps and users they are associated with. As best seen in FIG. 1, the diocard list view 13 is one such example. It provides a list of all the diocards 12 created, shared, and used by the user. As discussed in more detail herein, this means that diocards 12 can be shared among users, modified by different users, and the idea's changes and evolutionary trajectory can be tracked. In addition, the diocard 12 makes canonical designations and suggestions possible. This same diocard-as-smallest-effective-element feature makes it possible to show not only the evolution of maps from one timestep to another, but also the evolution of individual ideas from one timestep to another. Unlike map evolution, idea evolution (the way an idea changes from one timestep to another) provides the basis for human learning and is therefore important.

Figure 2:
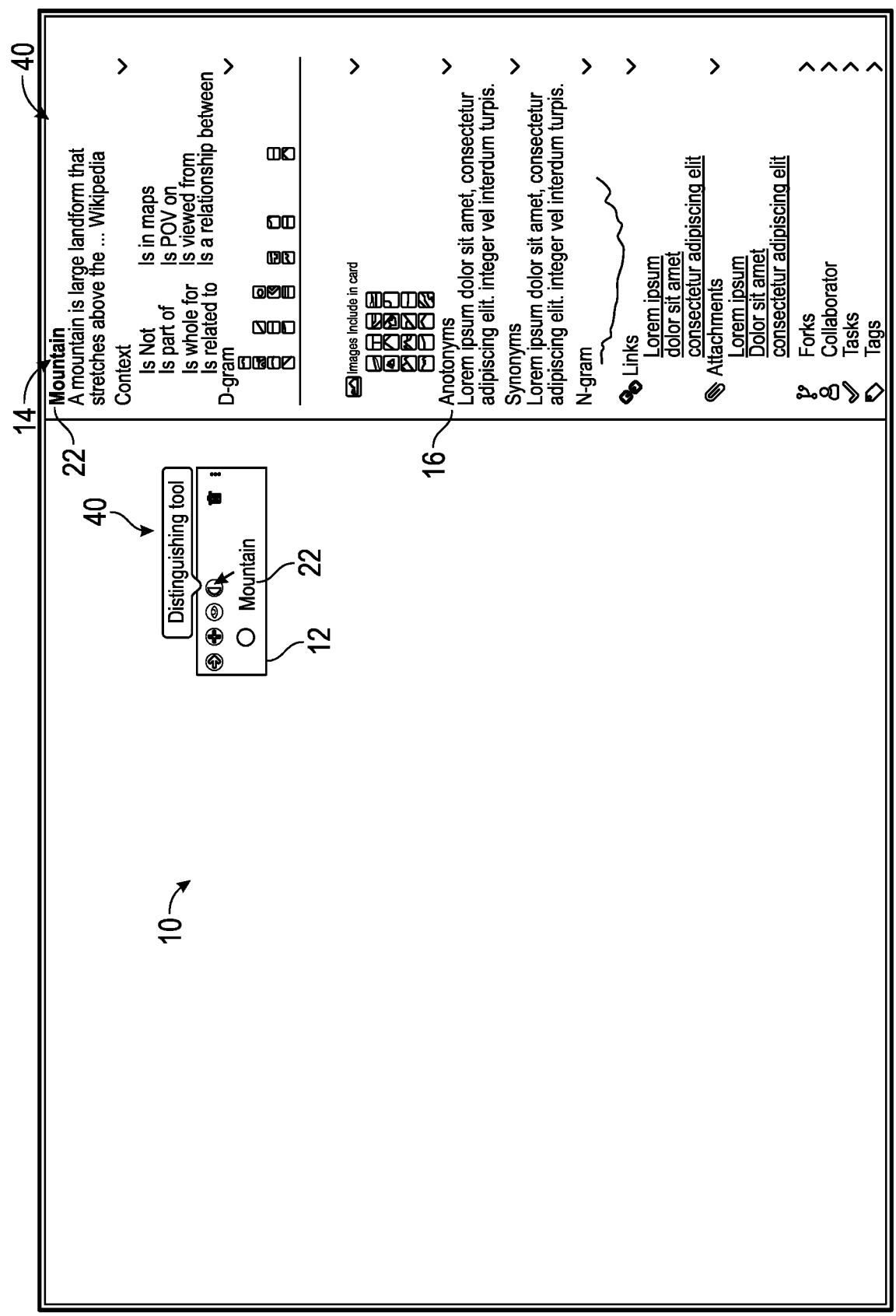
FIG. 2 is a schematic of an exemplary embodiment of a distinctions function in accordance with the present disclosure.

Diocards may also be thought of as inert shapes of various kinds, including cards, in other systems, methods, and/or software. They are structurally different in disclosed embodiments because they are "D=i/o cards" or diocards. This means that the fundamental element that disclosed systems and methods operate upon are new. This is because the way diocards are defined is fundamentally different. This may be called "distinguishing" cards rather than defining them, because while defining a card speaks to what it is (i.e., the card's "identity", distinguishing a card ascertains not only what a card is but also what it is not. In other words, as shown in FIG. 2, using the unique functions and processes described herein causes each diocard 12 to be defined by all of its attributes 14 as well as all of its non-attributes 16. Thus, the distinctions function 40 defines the individual idea represented by each diocard by attributes the individual idea is comprised of and by non-attributes the individual idea is not comprised of. In exemplary embodiments, the distinctions function 40 further defines a first individual idea 22 represented by a first diocard 12 as not being comprised of attributes of a second individual idea represented by a second diocard.

This distinctions function/process 40, when analyzed through big data (aka, use patterns), create something akin to "cognitive dark matter" that binds our cognitive universe together. Utilizing this technology, instead of randomly bumping up against miscommunications based on terminology, disclosed embodiments, which may be software or other systems or methods, can predict and reveal the potential for distinction problems and provide alternatives (such as those that exist in medical databases where doctors use the same term for different phenomena or alternatively use different terms for the same phenomenon). This distinction-making function/process (D:=(i↔o) where "A Distinction is defined as identity co-implying an other" and T(DSRP)→(D^S^R^P) where "The existence of D or S or R or P implies the existence of D and S and R and P.") is "existential" in that any argument/statement that can be made about the card that can be read linguistically as an "is statement" (e.g., X is _____) is salient to the distinctiveness of the card. However, this rule includes negation in the case of "X is not _____." Thus, in exemplary embodiments the distinctions function/process means that when a user makes a card they are making an "X is . . . " statement, but they are also making (if there are 10 other cards), 10 other "X is not . . . " statements.

Therefore, every user action is adding to the evolving "distinctiveness" of any given card. Our unique function/process also includes structural statements/arguments such as "X is part of . . . " or "X is related to . . . ". The net effect of this function/process is a global dictionary of terms asked on the way they are used not merely the way they are defined in a traditional database or dictionary. This is relevant because definitions only take us so far and all definitions are constantly evolving and being altered based on changes in context. Our function/process is capturing these changes in contextual meaning. Cognitively speaking the way something gets used (and who/what with) is how we actually make meaning of it, not merely how something is formally defined.

Figure 3A:
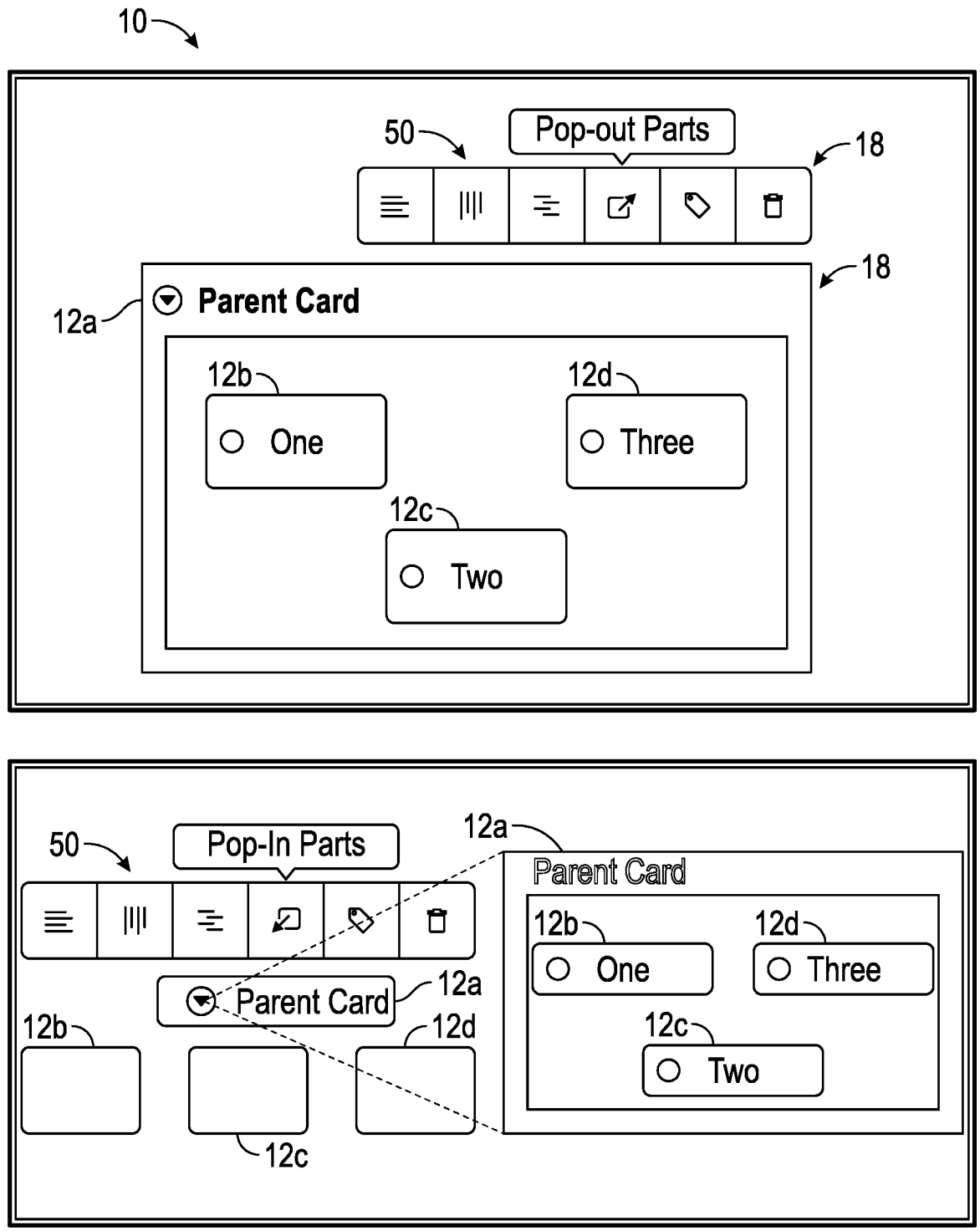
FIG. 3A is a schematic of an exemplary embodiment of a system and method of mapping, transforming, and sharing data showing systems functions and exemplary layouts in accordance with the present disclosure.
Figure 3B:
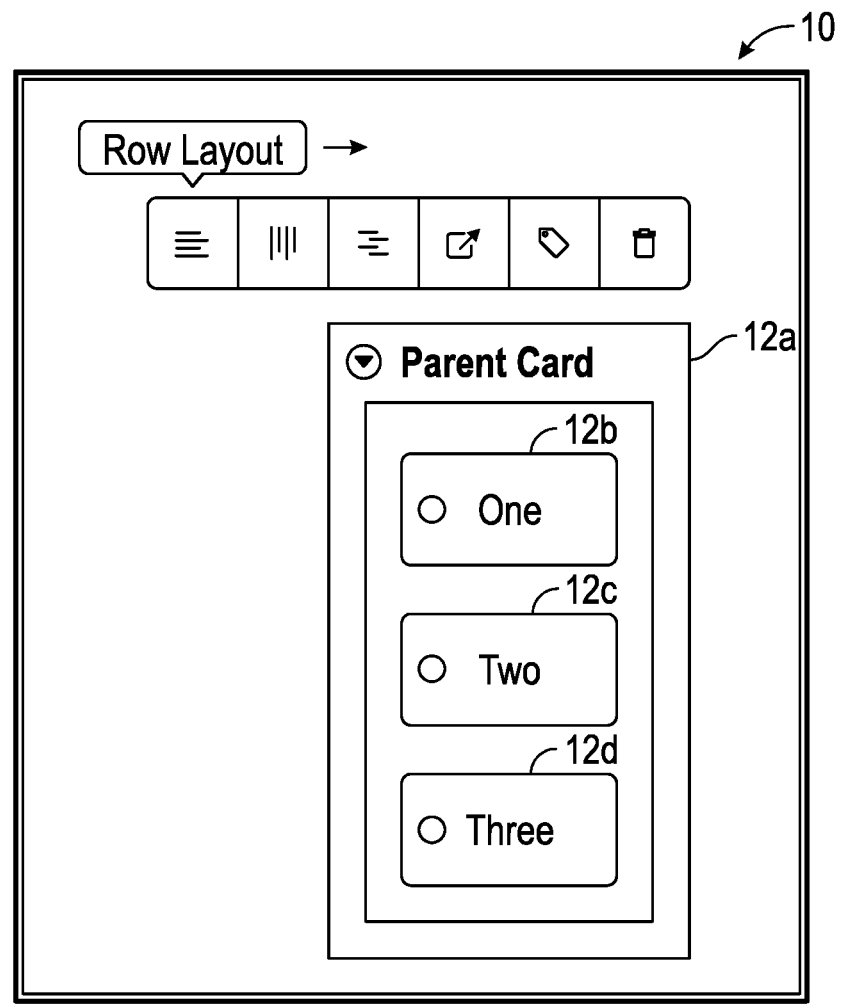
FIG. 3B is a schematic of an exemplary embodiment of a system and method of mapping, transforming, and sharing data showing systems functions and an exemplary layout in accordance with the present disclosure.
Figure 3C:
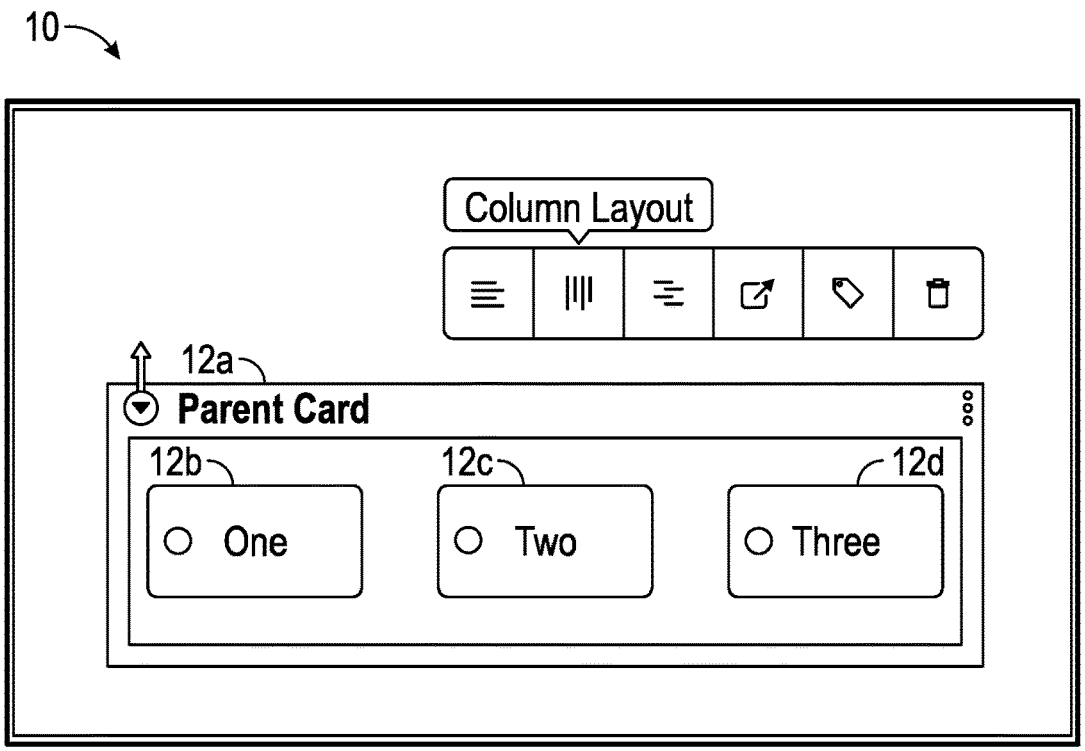
FIG. 3C is a schematic of an exemplary embodiment of a system and method of mapping, transforming, and sharing data showing systems functions and an exemplary layout in accordance with the present disclosure.
Figure 3D:
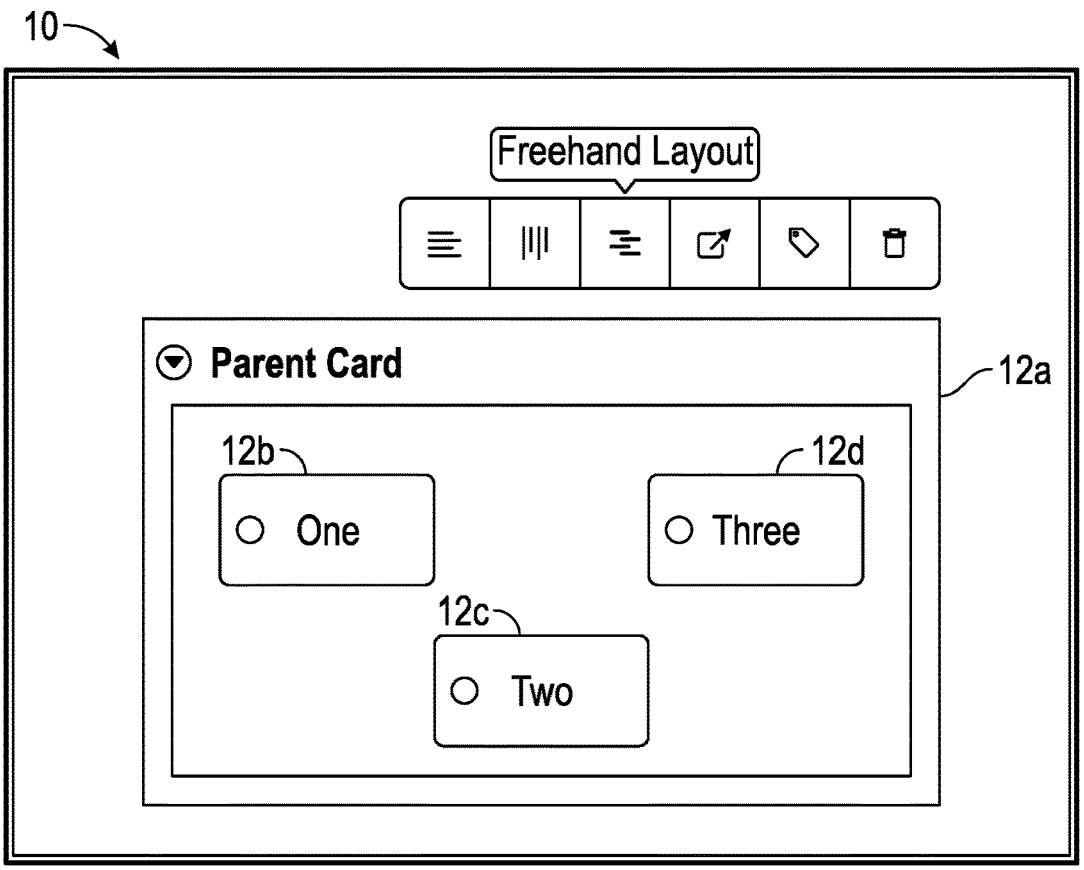
FIG. 3D is a schematic of an exemplary embodiment of a system and method of mapping, transforming, and sharing data showing systems functions and an exemplary layout in accordance with the present disclosure.

Referring to FIGS. 3A-3D, the systems function 50 defines the individual idea as part of a whole or a whole that can be broken into parts. This systems-organizing function/process (S:=(p↔w) where "A System is defined as a part co-implying a whole" and T(DSRP)→(D^S^R^P) where "The existence of D or S or R or P implies the existence of D and S and R and P.") means that any diocard 12 can be broken into parts which are themselves diocards. In exemplary embodiments, one of the diocards 12a constitutes a first map which can be expanded. Alternatively, it also means that any set of diocards 12b, 12c, 12d can be grouped and therefore become parts of a whole, at which time this new whole becomes a diocard. Parts can also be organized in various layouts such as row (FIG. 3B), horizontal list/column (FIG. 3C), freehand (FIG. 3D), or popout layouts (FIG. 3A). Popout layout 18 is unique in that it utilizes empty space efficiently and optimizes use of empty space. By default, in exemplary embodiments, child cards 12b, 12c, 12d will appear immediately under the parent card in row, column, or freehand layout. In other words, the systems function creates a popout layout 18 so one or more child diocards 12b, 12c, 12d appear in a row underneath the parent card 12a. By clicking the context menu on the parent card and selecting "Pop-Out Parts", you can have the child elements of that part "popped out" and displayed away from but linked to, the parent.

Any diocard 12 can contain a level of complexity equal to or greater than the complexity of the whole of which it is a part. Testimony to this fact is that any diocard can be an entire map of its own. This feature may be called "Semantic zoom" which refers to the idea that any diocard 12 can be a proxy for another map full of diocards, relational-diocards, and systems of diocards. Any diocard 12 in a map can be expanded into an entire map 10 for someone else to work on, or for the user to work on, and vice versa. This is particularly important for collaborative processes but also to keep maps clean. Diocards 12 may signify by use of color and icons that they are representations of much larger systems (maps). A hover-over reveals snapshots of the map 10 and a click reveals the map which can then be edited at will or "closed" bringing the user to the original Diocard.

Figure 4:
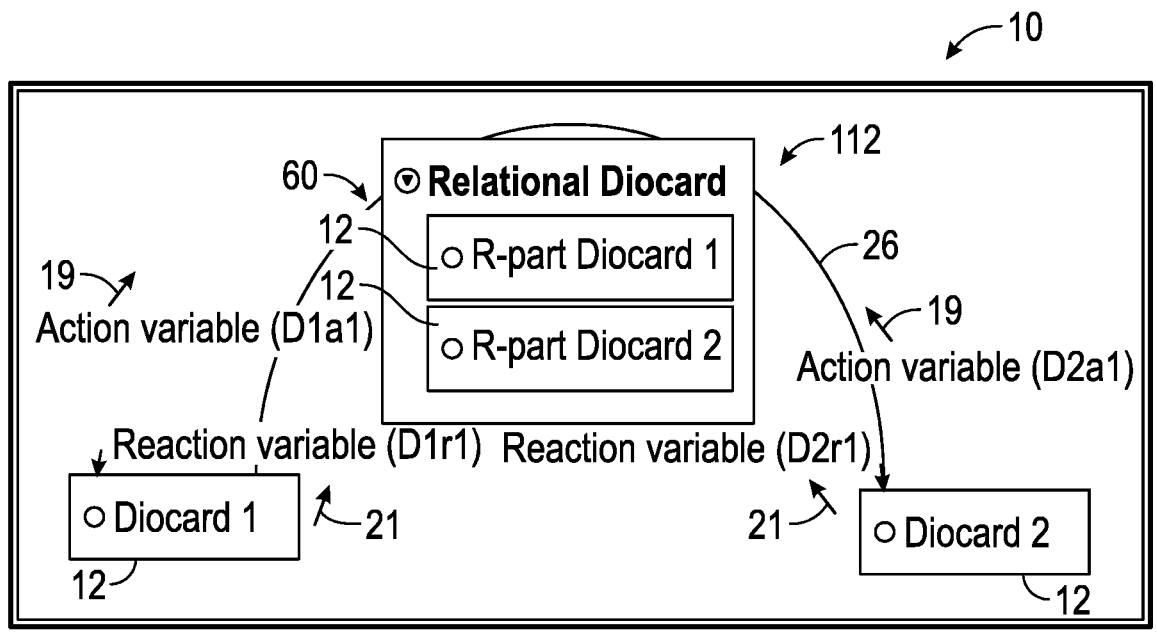
FIG. 4 is a schematic of an exemplary embodiment of a system and method of mapping, transforming, and sharing data showing exemplary relationships functions in accordance with the present disclosure.

Turning now to FIG. 4, exemplary relationship functions will now be described. In exemplary embodiments, the relationships function defines the individual idea as having a relationship with one or more different ideas. The way disclosed systems and methods treat relationships (R) is based on a function/process (R:=(a↔r) where "A Relationship is defined as an action co-implying a reaction" and T(DSRP)→(D^S^R^P) where "The existence of D or S or R or P implies the existence of D and S and R and P."). This has two larger implications. First and foremost, it means that when the user defines a relationship between two diocards 12, the relationship itself becomes a potential diocard (and in the data is a diocard). In other words, the relationships function may create a relational diocard 112 representing the relationship the individual idea has with one or more different ideas.

Right away this relational-card 112 takes on all the properties described herein pertaining to diocards 12. This is unique because it means that a single relationship can become, and the user is encouraged to cause it to become, a relational-distinction (an "RD"), a relational-distinction-that-is-systemic (an "RDS"), or a relational-distinction-that-is-systemic-and perspectival (an "RDSP"). Secondly, it means that the relationship takes on micro-relational qualities (variables) with the two diocards it interacts with. That is, an action-variable 19 and a reaction-variable 21 are created in the data structure of each relationship and, importantly, attached to each related card. This allows for extreme detail in defining relational variables in specific and mostly technical applications.

Referring again to FIG. 1, an exemplary perspectives function 70 defines the individual idea 22a as a point having a view 24 with respect to one or more different ideas 22b, 22c, 22d. Exemplary embodiments visually treat the idea of 'taking perspective' through the perspective-taking function/process (P:=(p↔v) where "A Perspective is defined as a point co-implying a view" and T(DSRP)→(D^S^R^P) where "The existence of D or S or R or P implies the existence of D and S and R and P.") is also unique. In effect, perspective taking is some data (diocard or diocards) looking at other data (diocard or diocards). Any of the diocards in any given system, including how they are organized into part-whole systems and how they are related and distinguished, can be viewed--and in turn altered--as the result of looking at them from some other diocard or set of diocards. In exemplary embodiments, the perspectives function 70 may create a first diocard 12a having a perspective with respect to one or more second diocards 12b, 12c, 12d.

One of the unique advantages of the perspective function 70 in disclosed embodiments is that diocards exist in their context. Therefore, any data can look at any other data, and the data that is looking at other data is often situated in its own, local, meaning-giving, context (i.e., with other data). In disclosed embodiments, point-of-view (POV) data are not divorced from their context (unassociated, replicated, decontextualized, or context-free) as in most existing systems. Some data (POV) can be used to look at some other data in a way that generates more new data as a result. It is also the case that because T(DSRP)→(D^S^R^P), perspective diocards can also be deconstructed into parts, yielding sub-perspectives as well as perspectival-relationships and perspectival-distinctions.

In the example of FIG. 1 two simultaneous perspectives on health insurance are shown—one from the point of view of a population group insured through their employer, and another from the point of view of insurance companies. Other perspectives are present but not activated so not visible. In some cases, perspectives may be complementary and so overlaying them as above is meaningful. In other cases, the systems support a side-by-side rendering that allows for comparing and contrasting views which may be fundamentally different from each other, either in content, structure, or both.

This system 1 provides the ability for the user to create wildly complex and adaptive maps 10 while utilizing a finite and simple set of functions. The DSRP function/process makes this possible. As discussed above, each diocard has just four possible primary functions. In exemplary embodiments, everything is a card 12 and every card utilizes the same four functions 40, 50, 60, 70. This means that the system is fractal, self-similar across scale, symmetrical, and simple. At any level of scale and in any position on the map, the same four functions govern user interaction. This is accomplished by code based on the DSRP formula for mental models, a more complex form of m=i+t.

$$m_n = \bigoplus_{info} \bigotimes_{j \leq n} \{ : D_o^i \circ S_w^p \circ R_r^a \circ P_v^\rho : \}_j$$

Figure 5:
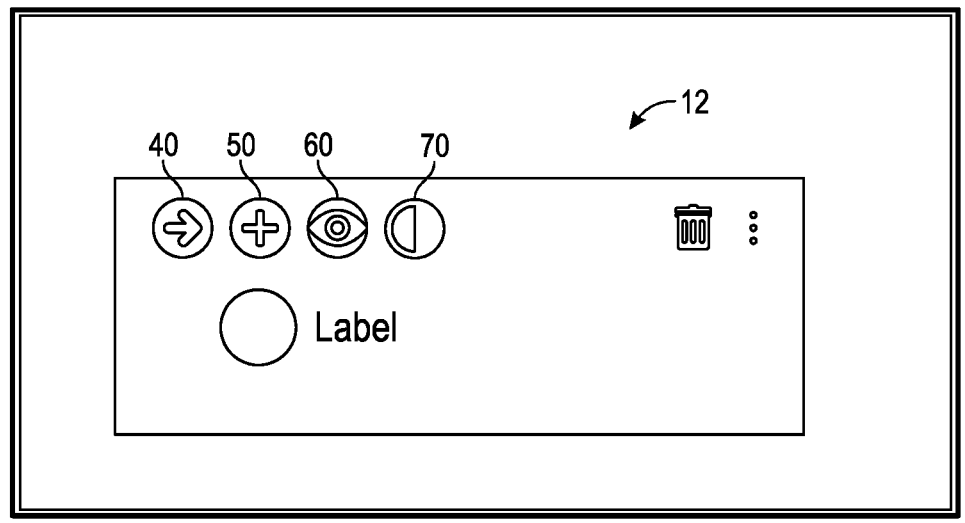
FIG. 5 is a schematic of an exemplary embodiment of a diocard in accordance with the present disclosure.

As shown in FIG. 5, any diocard 12 has four fractal functions—distinctions 70, systems 50, relationships 40, and perspectives 60 functions. The DSRP formula can be seen by the visual design of the card itself, where four primary functions are highlighted by icons on every card.

Figure 6:
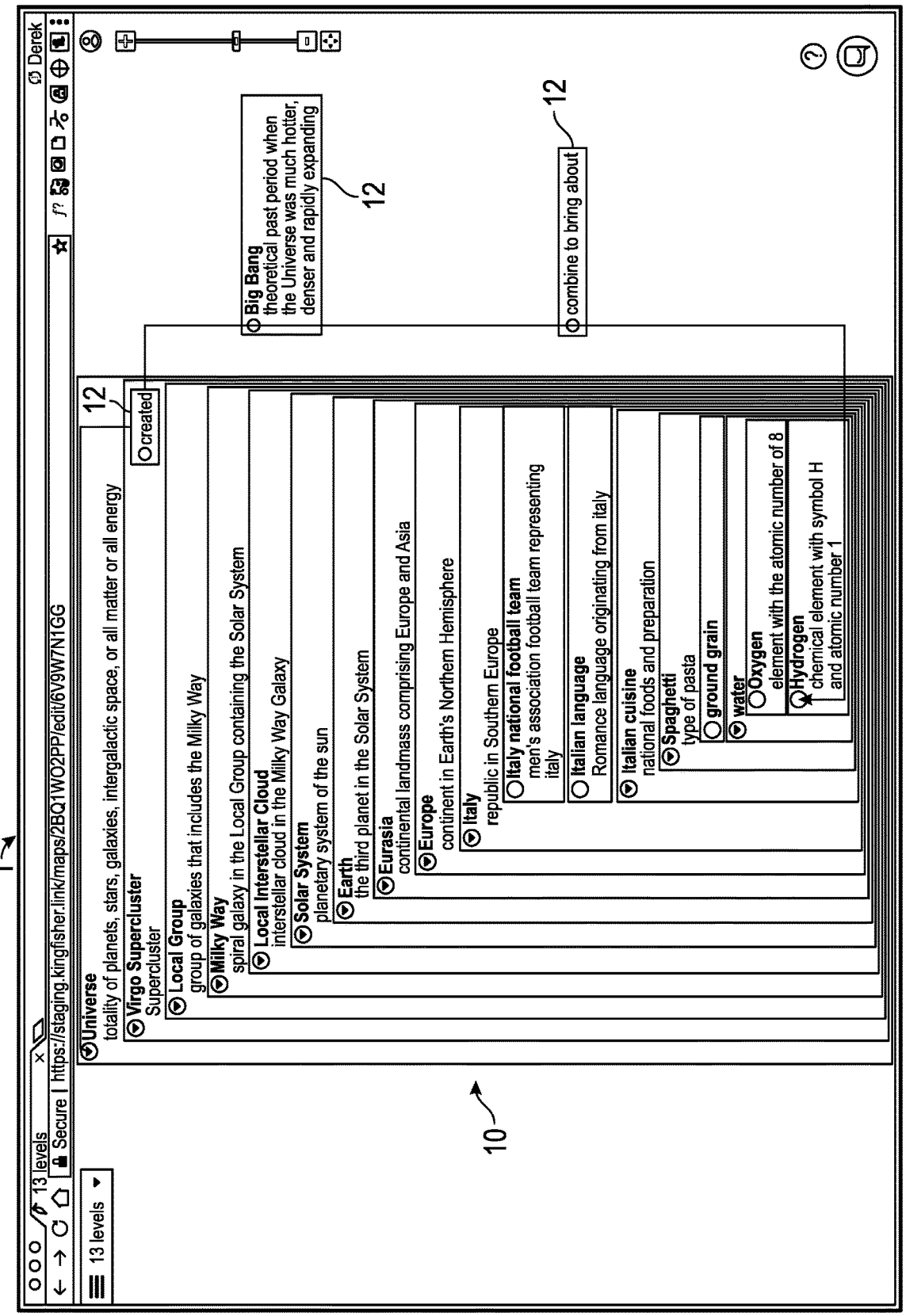
FIG. 6 is a schematic of an exemplary embodiment of a system and method of mapping, transforming, and sharing data showing exemplary nestedness functionality in accordance with the present disclosure.

With reference to FIG. 6, one of the advantageous features of exemplary systems 1 and software tools is the readability of the map 10 at high levels of scale and nestedness. This requires an integral set of variables involving structure, font, font size, sizing ratios and dynamic rendering in order to produce a map where things stay clear and legible so you can see many levels down without changing the view. The map in FIG. 6 shows sixteen levels of scale without losing readability.

Figure 7:
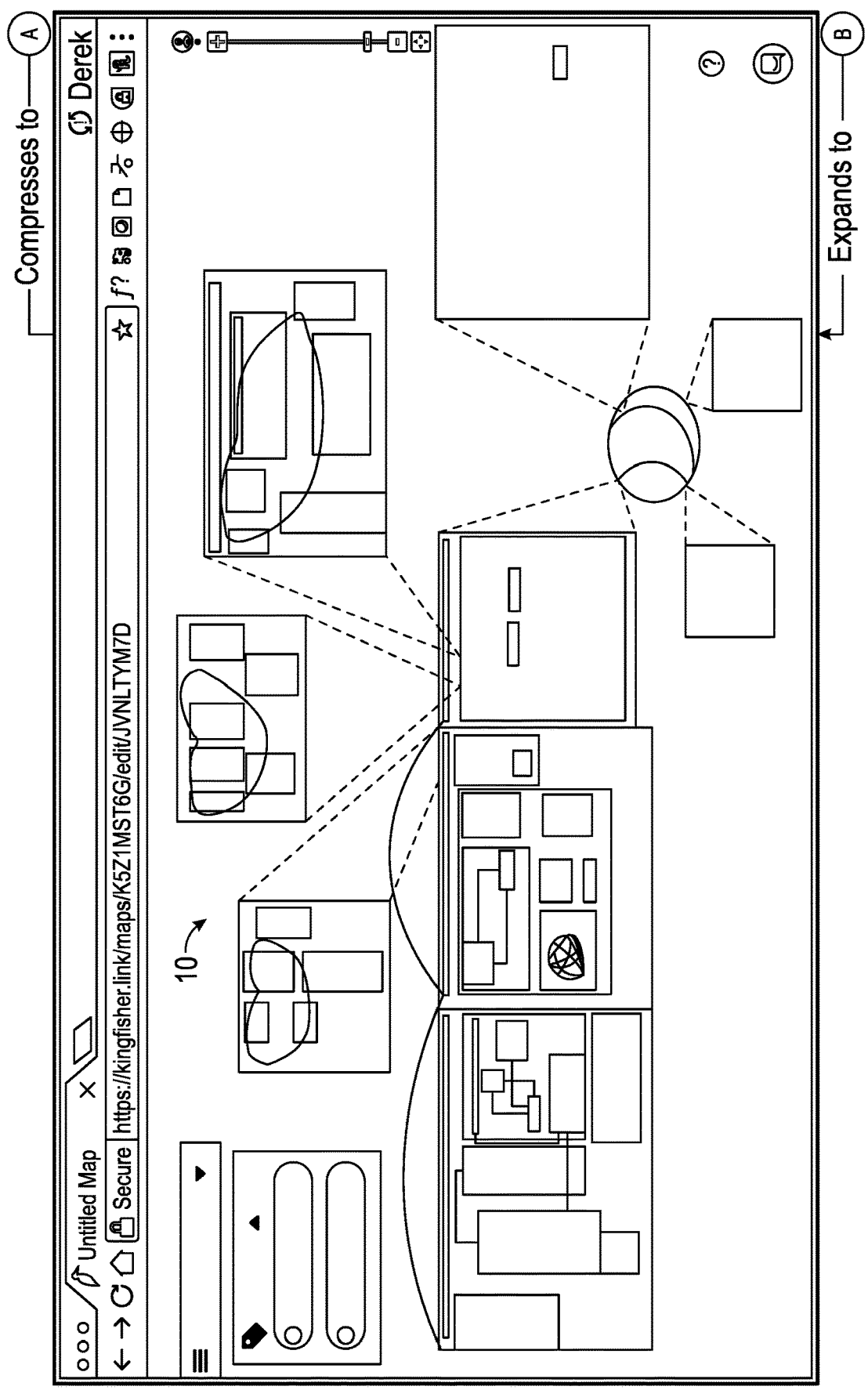
FIG. 7 is a schematic of an exemplary embodiment of a system and method of mapping, transforming, and sharing data showing exemplary compressibility functionality in accordance with the present disclosure.
Figure 7:
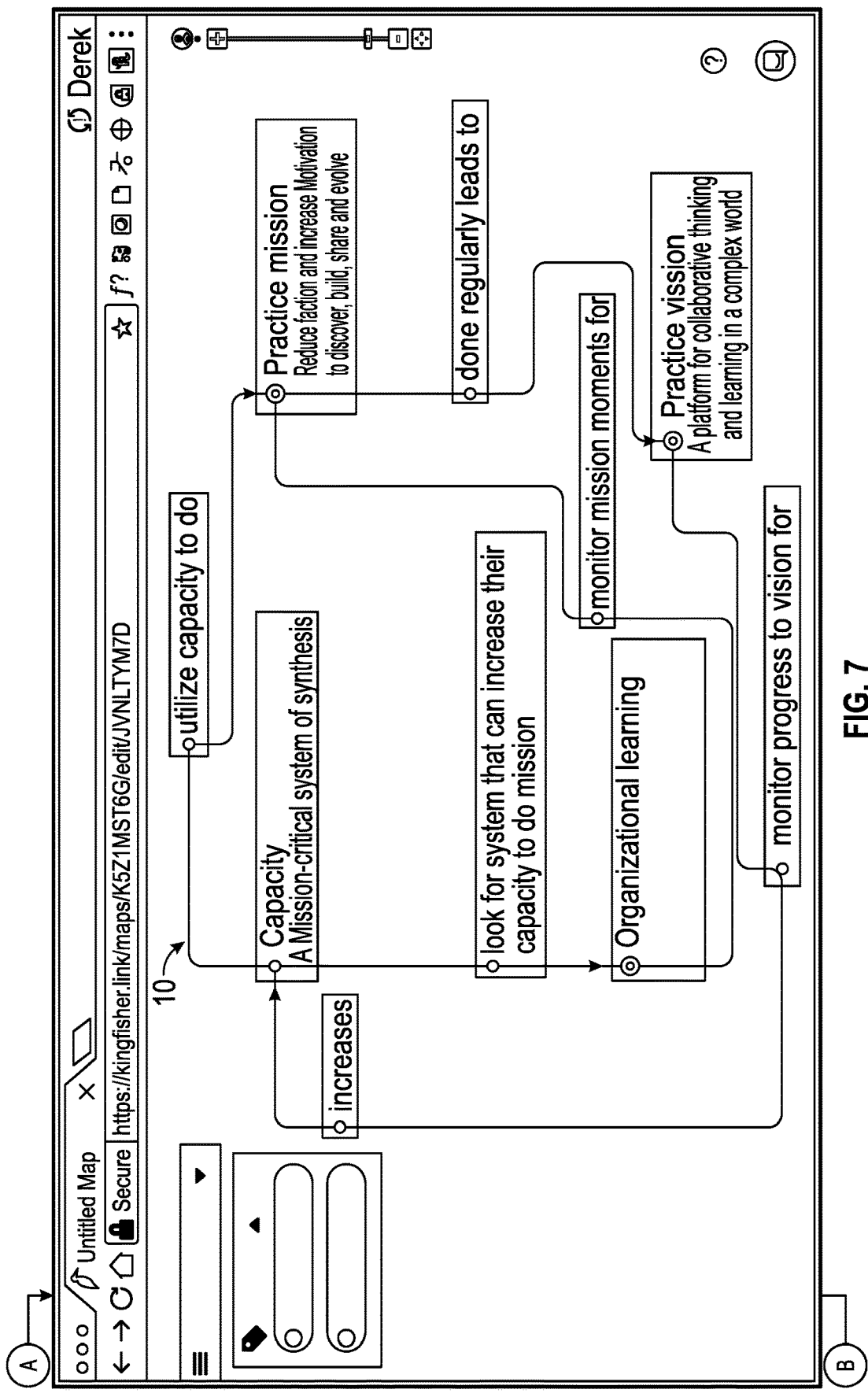
Figure 8:
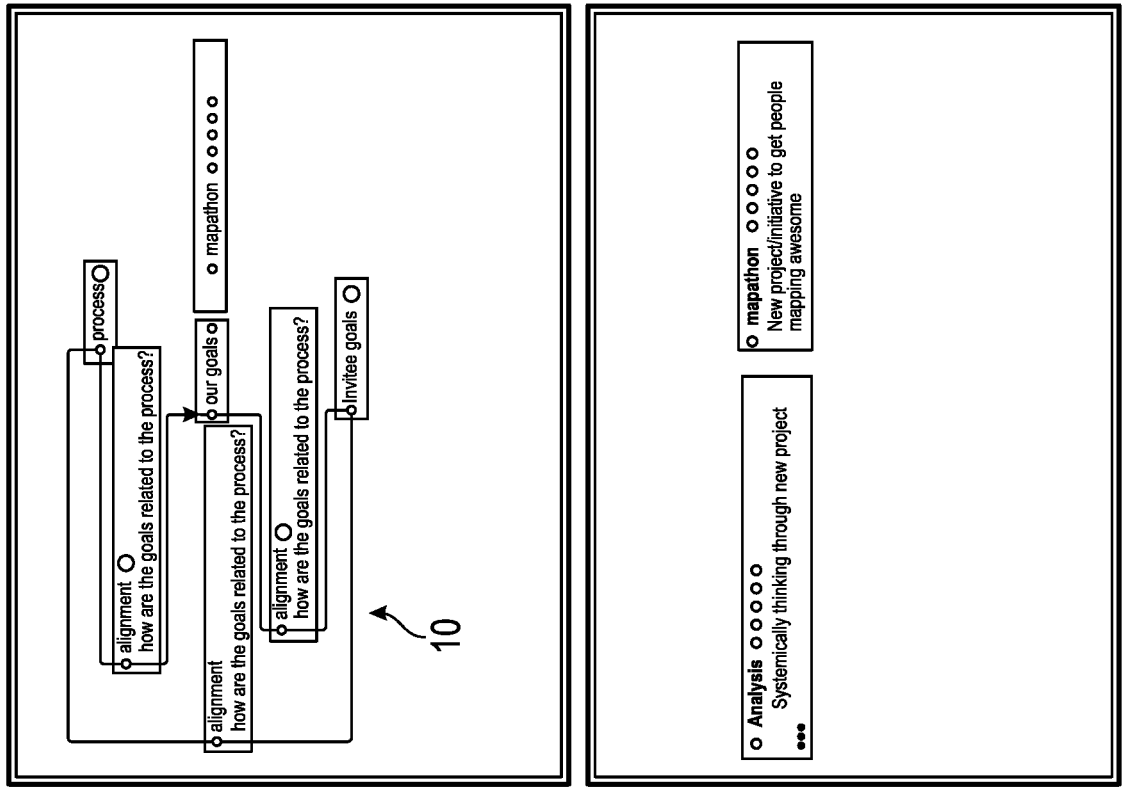
FIG. 8 is a schematic of an exemplary embodiment of a system and method of mapping, transforming, and sharing data showing exemplary compressibility functionality in accordance with the present disclosure.
Figure 8:
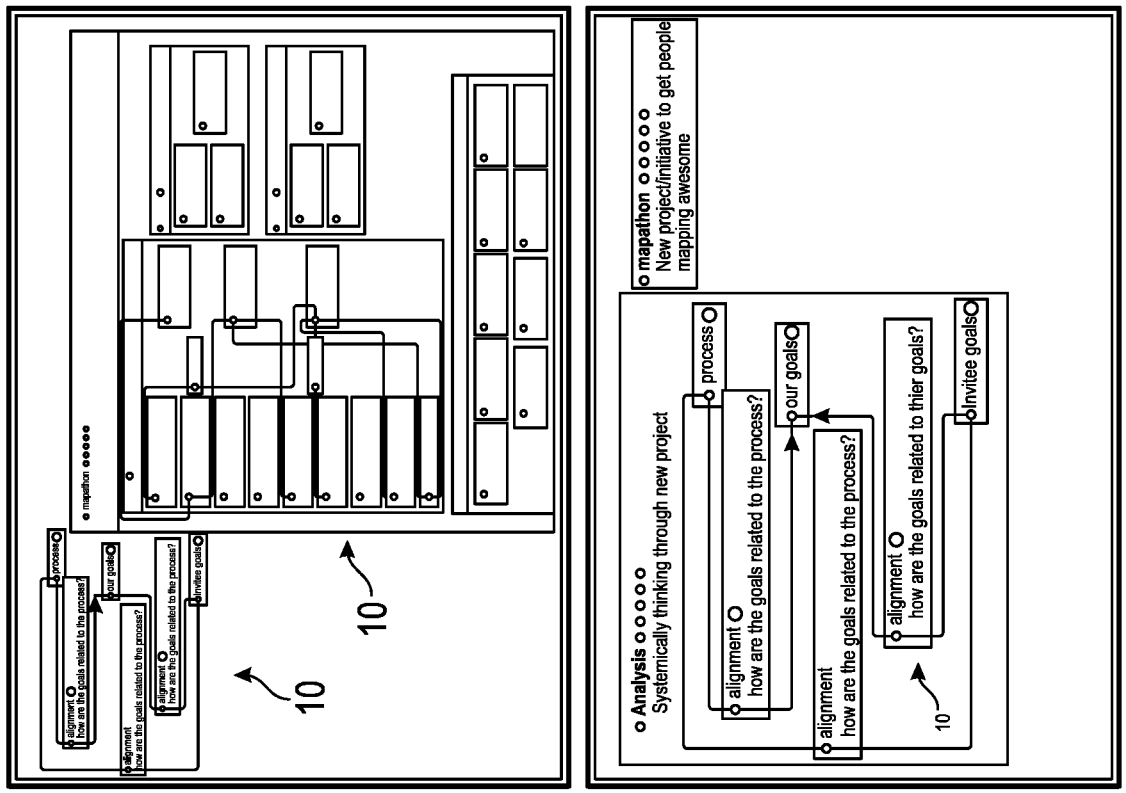

Turning to FIGS. 7-8, it can be seen that the unique structure (especially the systems function, but also the perspectives function) of exemplary embodiments inheres unique emergent property that maps are inherently compressible. Other systems achieve compressibility only through hierarchical structures, but disclosed embodiments achieve compressibility through a combination of hierarchy and perspective. This allows the user to look at everything at once or to collapse at different levels. Compressibility is measured as a fraction of collapsed diocards/total diocards. Here, FIG. 7 shows compressibility due to the systems function, and FIG. 8 shows compressibility due to the perspectives function. It should be noted that the compressibility aspects are very important cognitively and pedagogically for explaining complex ideas and systems.

Figure 9A:
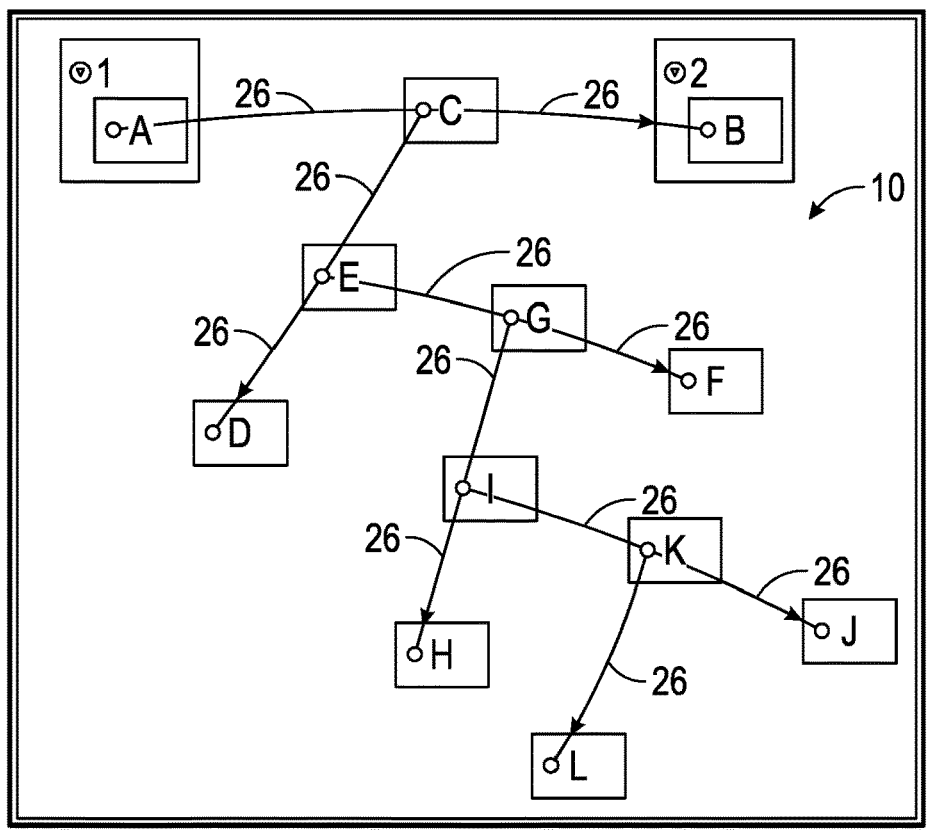
FIG. 9A is a schematic of an exemplary embodiment of a system and method of mapping, transforming, and sharing data showing exemplary nestedness and compressibility functionality in accordance with the present disclosure.
Figure 9B:
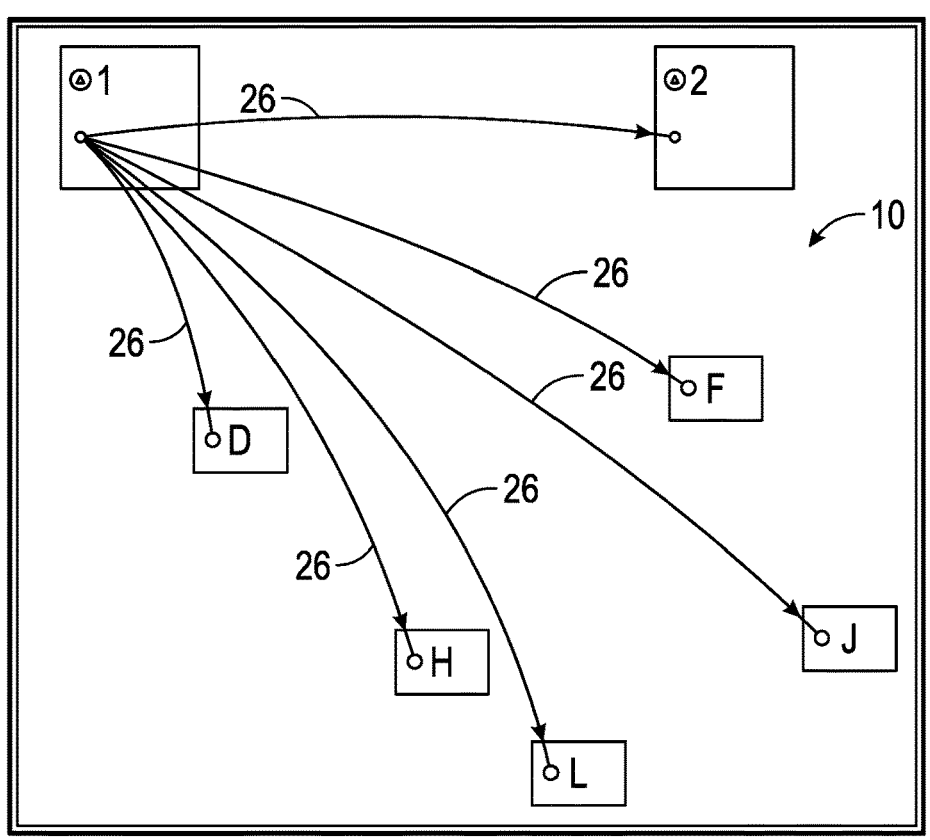
FIG. 9B is a schematic of an exemplary embodiment of a system and method of mapping, transforming, and sharing data showing exemplary nestedness and compressibility functionality in accordance with the present disclosure.

FIGS. 9A-9B illustrate the feature of relationship compressibility. One key aspect of exemplary embodiments is that relationships may be part of a larger whole in addition to connecting two ideas. Relationships 26 may also be built off each other so that any system could contain a deeply nested sequence of relationships. FIG. 9A shows nested relationships 26 uncompressed and FIG. 9B shows the same nested relationships 26 with the top-level systems compressed. When the system at the top level is compressed, the relationships connected to its members are redirected to the parent idea, manifesting the idea that a relationship with a part of a system implies a relationship with a parent. Exemplary compressibility scores are as follows: Raw C-score: 0.98//Average C-score: 0.50//Weighted Average C-score: 0.74.

Exemplary maps are interactive and dynamic. When a user collapses a node 28 to hide its children, surrounding nodes 28 may automatically come closer to fill the space that used to be occupied by the now-collapsed children. Similarly, when a collapsed node is expanded, surrounding nodes will move away to make space. The novel process used to determine exactly how nodes should move automatically starts by combining physics models with heuristics derived from the original human-determined placement. After that, exemplary embodiments learn progressively from manual "nudges" by humans after nodes have been automatically arranged, both in the specific context of the given map and nodes in question, as well as in the general context any map and similarly sized nodes placed relative to each other in a similar way.

In more detail, first a gravity quotient is assigned to each node based on its area, and then cluster nodes into groups using a second "mean-shift" approach. For the "heuristics" part, the system detects and scores human-intended node-to-node alignments where it is determined, for example, if nodes are top-aligned to each other, or aligned with their center points in a grid, etc. When a user expands or collapses a node, the software first moves cluster-by-cluster, and then within each cluster, moves the "heaviest" nodes first and lets their gravitational pull move their children along-with. Finally, the system applies "nudges" learned from previous human corrections, with learning via auto-encoder neural network models. As a result, the user always sees an information-dense, aesthetically-pleasing harmonious layout, regardless of what level of detail is being shown or hidden at any part of the map.

Figure 10:
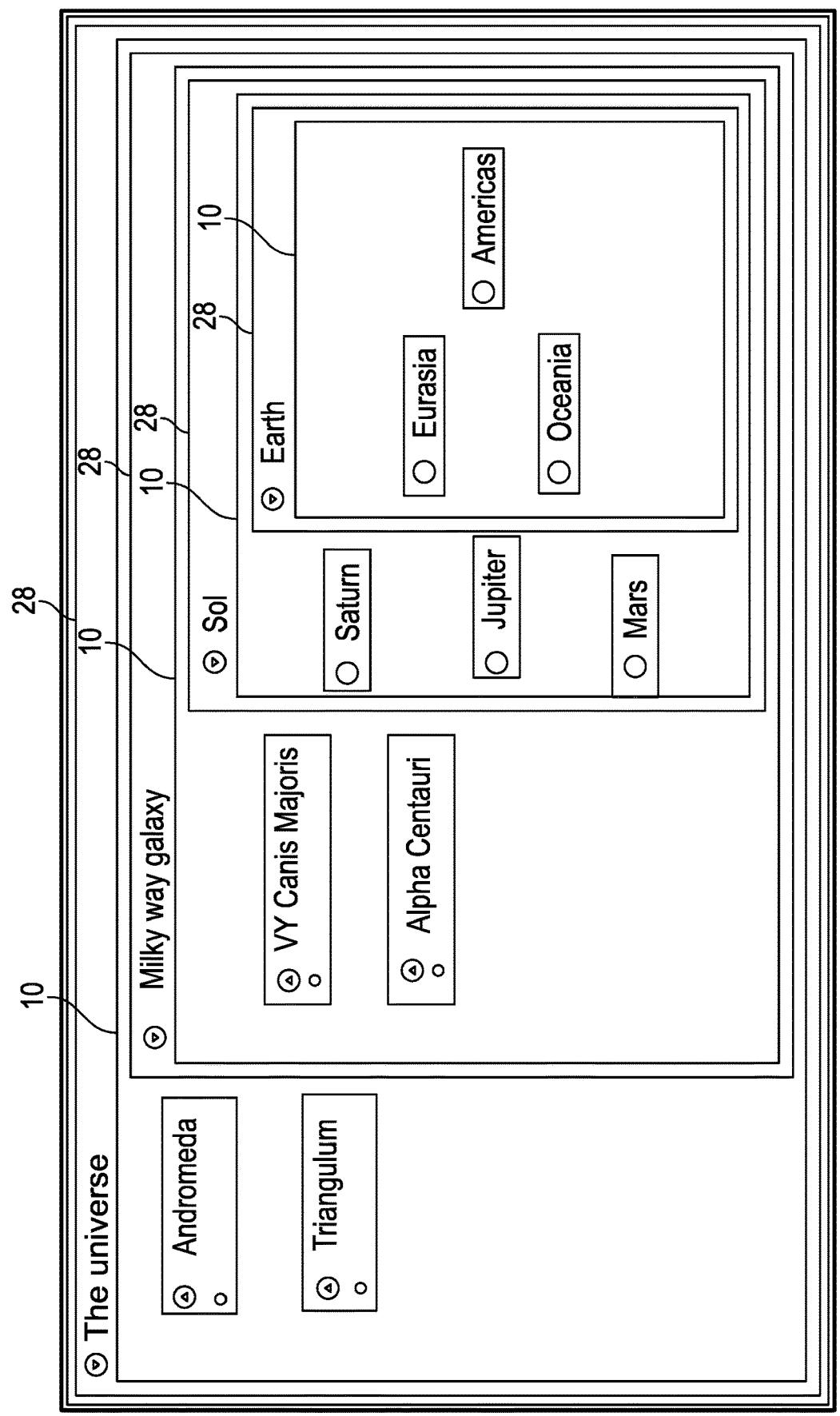
FIG. 10 is a schematic of an exemplary embodiment of a system and method of mapping, transforming, and sharing data showing exemplary nested maps and nodes in accordance with the present disclosure.

Another unique quality of exemplary embodiments is how they represent the fractal nature of knowledge. Every distinct idea can be drawn out as a whole system, and elements of that system can be drawn out into yet another system . . . and so on. Exemplary embodiments provide the framework for displaying these nested systems as maps 10 within a node 28, where a user can "zoom in" indefinitely to see finer and finer details within some larger whole. This feature of a map 10 inside a node 28 with maps 10 nested inside each other can be seen in FIG. 10.

Figure 11:
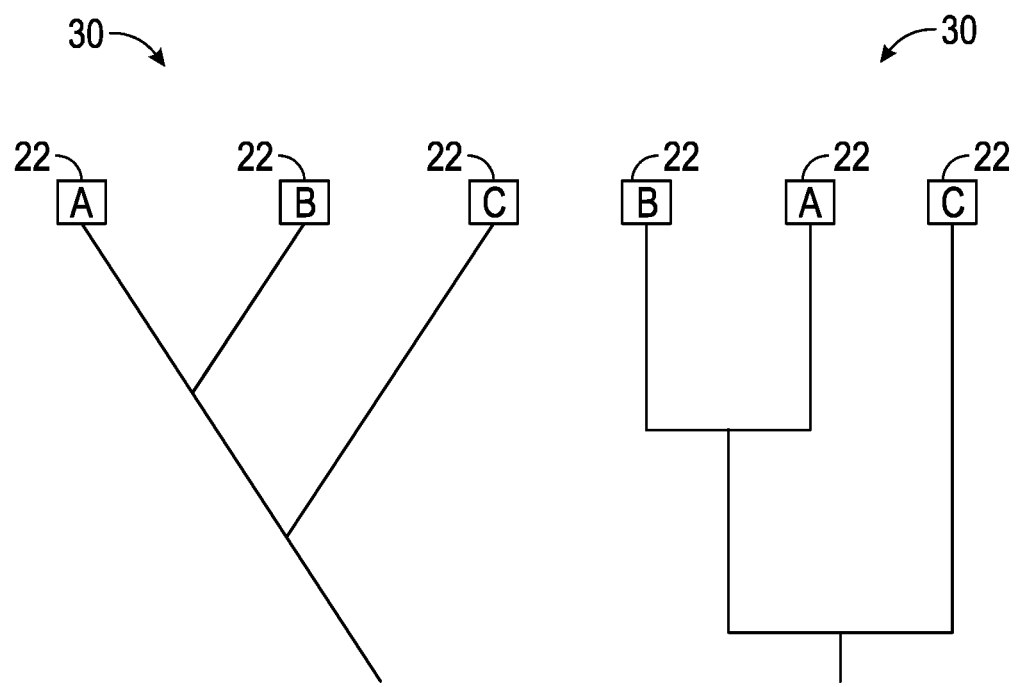
FIG. 11 is a schematic of exemplary embodiments of cladograms in accordance with the present disclosure.

In exemplary embodiments, diocards can be not only created by a user but shared with others and also "forked" (i.e., modified on a different evolutionary vector) by other users. This shift in the way exemplary embodiments work has some profound implications. By way of example, co-author citation in academic journals allows us to produce networks detailing which authors have cited other authors' papers. In that scenario, the academic published paper is the fundamental element, which would be akin to a map. Instead, exemplary embodiments make the smallest effective element not the map or paper level collection but the single, "individual idea" (i.e, a diocard) contained within this collection. This means that a single idea can take on similar properties and users can share single ideas as well as fork individual ideas; all the while maintaining the evolutionary path associated with this usage and these forkings. As one example, shown in FIG. 11, the system can create co-author citation networks for individual ideas or, alternatively, show evolutionary trees or "cladograms" 30 for ideas 22.

In addition to idea cladograms 30, the ability to track any given idea's 22 evolutionary trajectory means that disclosed systems and methods can track and analyze changes in ideas—in other words changes in mental models. A change in a mental model is the formal definition of individual learning ($L_i$=Delta m; "individual learning is a change in a mental model") and organizational learning ($L_o$=(Delta m)s); ("organizational learning is a shared change in a mental model"). This means that exemplary embodiments can provide analytical data and reporting on both individual learning over time as well as organizational learning.

Exemplary embodiments of function/process for mental models (simplified as, m=i+t) operate on three, rather than one, dimensions. Disclosed systems and methods distinguish between information content (data supplied by the user) and cognitive structures (DSRP). Inasmuch, this simple but powerful function/process can be used to enhance and differentiate analysis, provide user guidance and suggestions, differentiate reporting features, etc. For example, the user can be given three styles of reports: content only (i reports), cognitive structure only (t reports), content and structure (i and t reports). The same holds true for analytical functions and guided or suggestive features. An i-report is a report (or analytical or suggestive feature) that focuses on the information content of the diocards (the words, phrases, images, and content attributes). In exemplary embodiments, users could compare and contrast maps in terms of information only or receive information suggestions or analytics based on information they put into the map, which could include additional information content that they did not put into their map (using basic analytics, NLP, ML, or AI). The same is true for the cognitive structure reports. A user, for example, could receive a report, analytics, or suggestions on the DSRP structure only or compare and contrast maps based on this DSRP cognitive structure. Alternatively, the report, analysis, or suggestions could be based on both information content and cognitive structure.

In exemplary embodiments, the system can make structural predictions for the user or encourage the user to use structural predictions to create new knowledge based on its unique DSRP structure. It may do this by using the user's own input and DSRP structure to suggest new structural combinations (based on DSRP) which act as proxies for information. For example, if the user has two diocards, exemplary embodiments predict that there is a relationship between them and can therefore offer the user the structural prediction that there is which the user can decide to accept or decline. Once accepted, exemplary embodiments can make another structural prediction: that the relationship is a distinction and the user can accept or decline the attachment of a diocard to the relationship (e.g., have you thought about this relationship between them?). Similarly, any diocard can be structurally predicted to have parts and therefore the user can be prompted as much (e.g., Have you thought about the parts?) Likewise, any diocard can be structurally predicted to act as a point-of-view or frame on any other card or cards. The user can then decline or accept such a suggestion. These are general [structure-only] examples but could also be content-specific based on machine learning. It is important to note that this set of features makes two things possible: (1) it enables the user to make better structural predictions, and (2) the system itself makes structural predictions.

Figure 12:
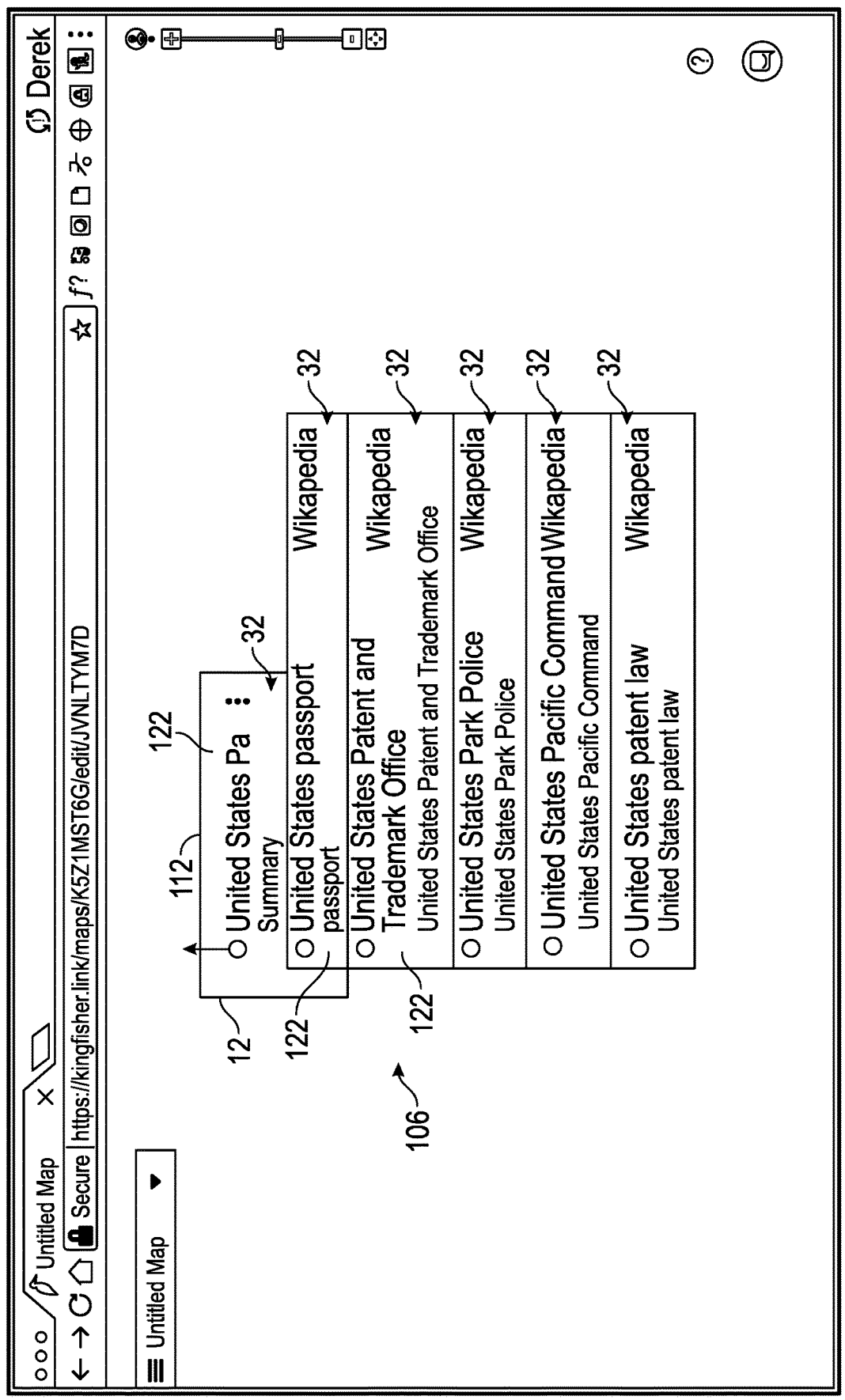
FIG. 12 is a schematic of an exemplary embodiment of a system and method of mapping, transforming, and sharing data showing exemplary canonical ideas functionality in accordance with the present disclosure.

Referring to FIG. 12, in exemplary embodiments the system provides for canonical diocards and databases and can automatically generate canonical databases and suggestions based on personal/private/public databases. The diocard 12 makes possible canonical suggestions and autofill. Because of the unique structural properties of DSRP, exemplary embodiments are capable of producing greater relevancy in auto-complete or auto-fill based on suggestions that occur as the user types letters into the Diocard label field. In other words, the map 10 generates canonical suggestions in a diocard label field 32 based on canonical ideas from use of the map. These databases are automatically created as users interact with the software or other system. Whether they are personal, private or public is up to the user, but it means that every idea you create you can use and reuse in any map or on its own. This has relevance and significance in expert systems where a database of individual diocards can be used and reused ensuring consistency across users and increase construct validity, validity in general, and reliability.

Figure 13:
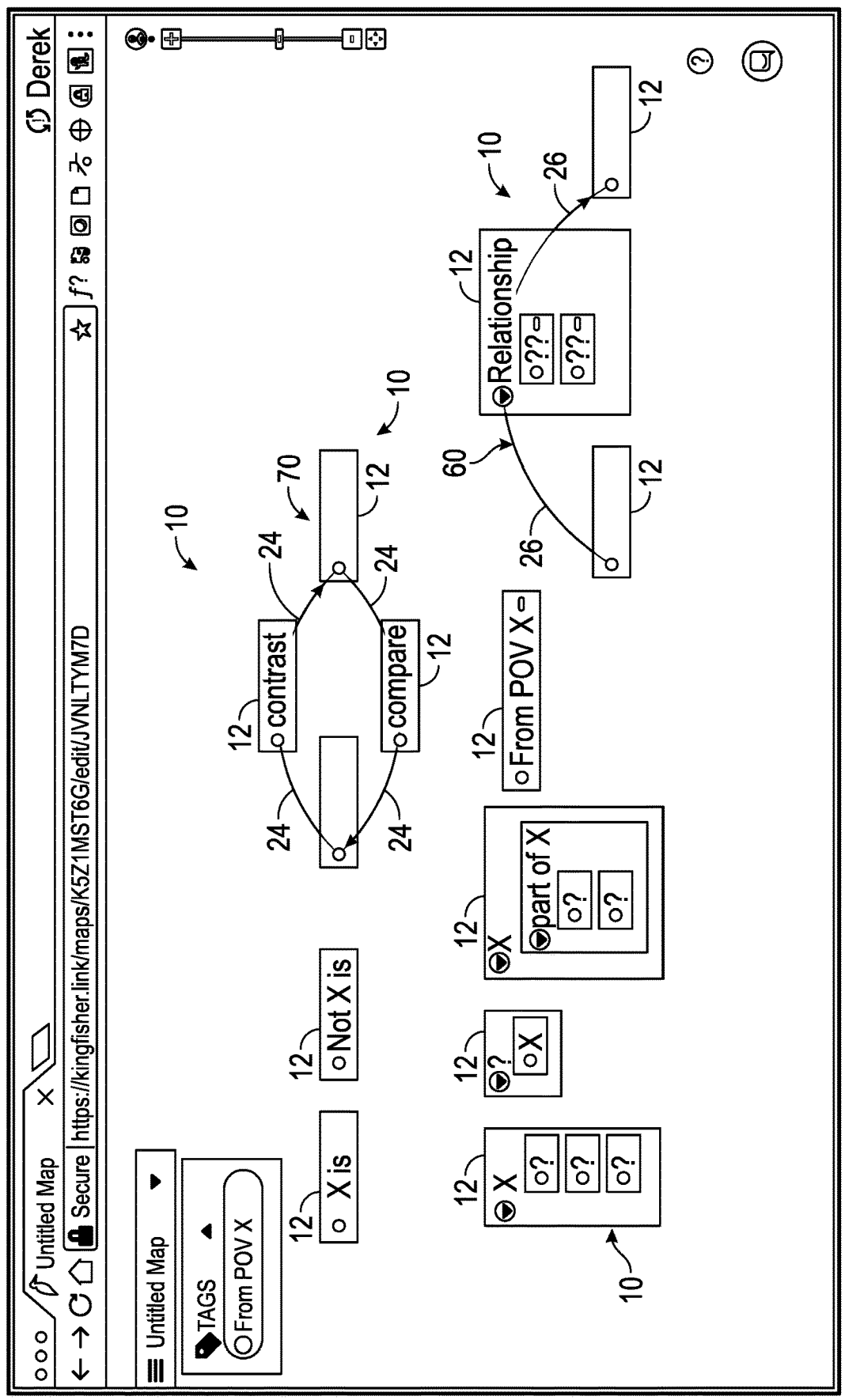
FIG. 13 is a schematic of an exemplary embodiment of a system and method of mapping, transforming, and sharing data showing auto-generated map functionality in accordance with the present disclosure.

With reference to FIG. 13, exemplary embodiments can auto-generate maps 10 from DSRP questions. DSRP can be converted into the form of structural questions which can be poised to the user using a "MadLib" style of search where users type certain topical keywords and a map 10 is auto-generated from the completed sentence. Examples of such questions include:

Distinctions
 1. What is _____?
 2. What is-not _____?
 3. How would you distinguish between _____ and _____?
 4. Can you compare and contrast _____ and _____?

Systems
 1. What are the parts of _____?
 2. What is _____ a part of?
 3. Can you name some of the parts of the parts of _____?
 4. What are the parts of the relationship between _____ and _____?
 5. What are the parts of when looked at from the viewpoint of _____?

Relationships
 1. What ideas are related to _____ and what ideas are related by _____?
 2. What idea relates _____ and _____?
 3. How are the parts of _____ related?
 4. How are the parts of _____ related to the parts of _____?
 5. What are the relationships among _____ and _____ and other things?

Perspectives
1. When looking at _____, can you identify the perspective it is viewed from, and the subparts of that perspective?
2. Can you think of _____ from multiple perspectives?
3. How are _____ and _____ related when looking at them from a new perspective?
4. What are the parts of _____ when looked at from multiple perspectives?

In addition to auto-generated maps from structural questions (DSRP), exemplary embodiments can auto-generate maps from content such as simple lists, spreadsheets, or paragraphs—sometimes using machine learning. For example, a bulleted list from a word processing program can result in a part-whole structure. Spreadsheet tables where data is organized by column can generate perspectival structures. The system's Tao Script language and technology is one example of inputs using a simple entry mechanism (like on a phone) which could either use text or symbol helper-text to facilitate entry of maps with textual inputs.

Another advantageous feature of disclosed embodiments is real-time collaboration with rewind and fast forward, branching and merging. Maps can be updated and interacted with via operations. Operations are discrete functions that modify the graph that underpins the map. Operations are first applied locally to a user's map view, then recorded in a central store where they are sequenced, and finally broadcast to any other map collaborators where they are applied, keeping many users' views synchronized in real time. There are no arbitrary limits on how many users may modify a map simultaneously. The collaboration can be perspectival, not just content. Exemplary embodiments facilitate synchronous and asynchronous collaboration. Using the perspectives function described above, any user who engages in a collaborative map can select the option of seeing the information and structure from the perspective of other collaborators and compare and contrast perspectives.

Maps also can be rewound and fast forwarded to any point in time. The map will be drawn based on the operation sequences that have been written to the central store up to that point in time. This rewinding and fast forwarding may be broadcast to map collaborators in real time in presentation mode. In addition, users can branch a map represented by any operation sequence, making a copy that retains a full history of the map operations to that point. History can be squashed, providing a clean slate for future collaboration, or preserved across s to retain complete, multi-lineage history (which can be rewound and fast forwarded, branched and merged). Branched maps from the same lineage can be merged automatically when no conflicting operations exist after the branch operation sequence, heuristically when the merge function can pick the winners in the case of conflicting operations that occurred after the branch operation sequence, or interactively when the user performing the merge wants to pick which operations to apply from the merge candidates.

Figure 14:
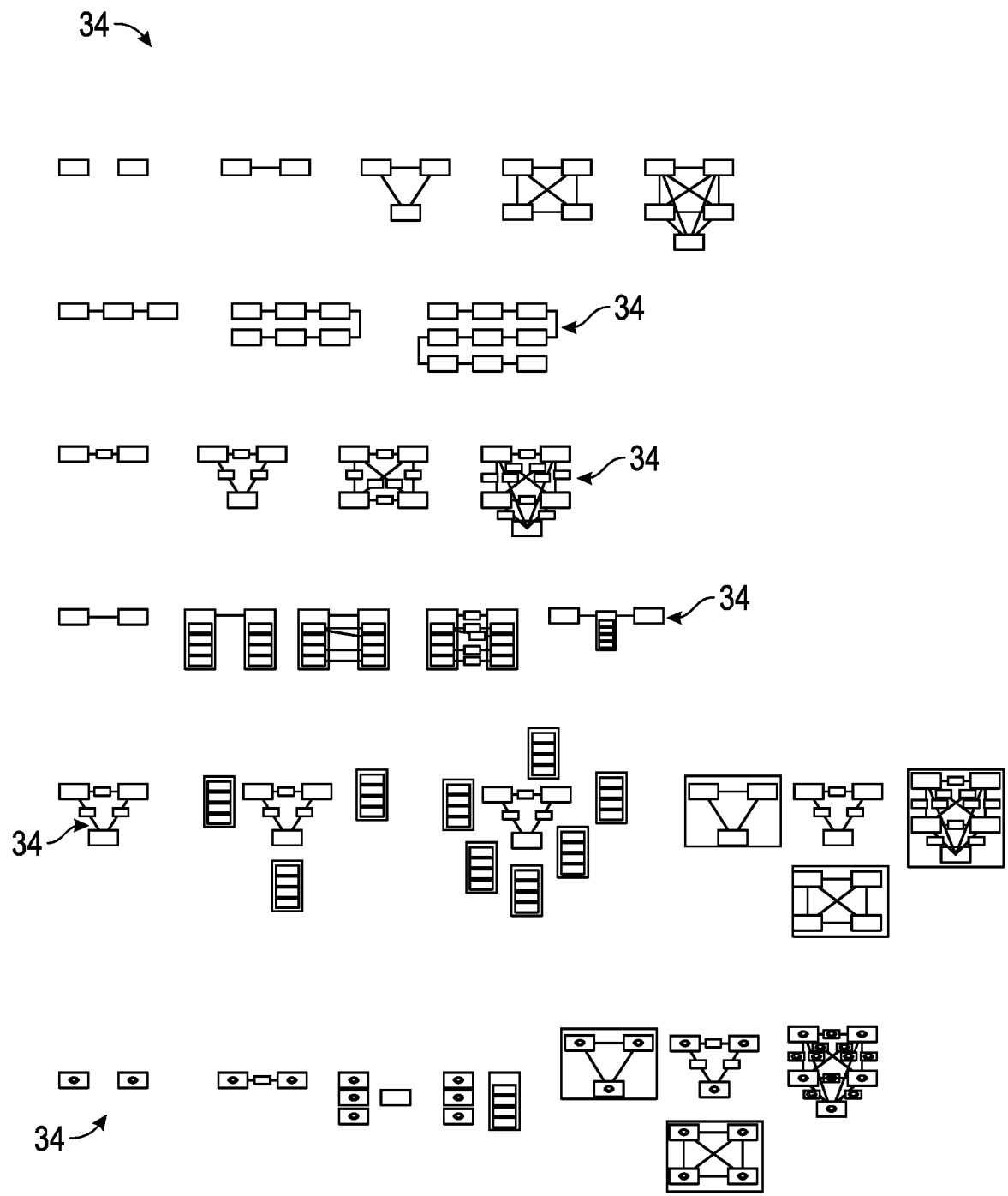
FIG. 14 is a schematic of an exemplary embodiment of a system and method of mapping, transforming, and sharing data showing exemplary cognitive jigs in accordance with the present disclosure.

The establishment of atomic level patterns of systems thinking (DSRP) and its reduction to practice in software, also allows for the identification of dozens or perhaps hundreds or thousands of the molecular structures and patterns called structural or cognitive jigs 34. Referring to FIG. 14, structural jigs 34 may be used as templates in exemplary embodiments. Cognitive jigs 34 are emergent structures with or without data content. They are interdisciplinary in that they often cut across topical domains. Because of the system's unique m=i+t function/process, exemplary embodiments are capable of producing a large number of structural cognitive jigs as templates the user can utilize saving them time and effort. In addition, jigs can take at least three forms: content only (i jigs), structure only (t jigs), content and structure (i and t jigs). The ability to generate these jigs from use patterns (big data) and use them is unique. Users simply drag a templatic visual icon of any given jig onto their map and they can begin editing the structure. The software is capable of utilizing its unique structure, combined with big data and demographic or psychographic properties to identify new molecular-level cognitive jigs. A number of these jigs have already been discovered. But more jigs in industry-specific, discipline-specific, gender-specific or other demographically specific patterns are made possible for discovery.

Exemplary embodiments could be considered developmental software in that they help people develop skills and change behaviors as they use it. As part of this effort, exemplary embodiments may be integrated with a validated measurement indicator called Systems Thinking and Metacognition Inventory (STMI) to provide an ongoing developmental trajectory of skills development and behavioral change along with statistical snapshots in time that provide the user incentive (through tooltips, gamification, etc.) of their progress. The Systems Thinking and Metacognition Indicator (STMI) itself provides a validated assessment of systems thinking and metacognitive abilities. However, exemplary embodiments expand on this assessment by providing ongoing statistics based on user created maps and ideas.

Exemplary embodiments include methods of sharing ideas. Exemplary methods include creating one or more diocards 12, creating a map 10 comprised of the one or more diocards, and sharing between at least two users the individual idea 22, one or more diocards, the map, a template of the map, and/or a library of maps. Individual ideas 22 may be shared symmetrically or asymmetrically. As discussed above, some ideas crystalize to become canonical ideas 122. The user or the software may designate one or more diocards as canonical and the ideas contained in the diocards as canonical ideas. Users of disclosed systems and software can organize canonical ideas into topical areas (collections or libraries). And an idea can exist in multiple libraries at once, not just one map (CD).

When the elemental canonical unit is an idea (atomic or molecular) it means that users can share ideas as objects. It also means that users can share topical collections of ideas (libraries). More particularly, exemplary embodiments include organizing one or more diocards 12 as canonical into a library. And that the same canonical idea can exist, and be shared, as part of numerous collections. The trading and exchanging ideas electronically via disclosed embodiments can be analogized to millennials currently exchanging and trading songs and libraries and contrasted with the traditional situation where a single song was locked into a categorical and discrete CD or "tape". The song could be separated from the list of songs it was part of and any song could be part of multiple lists. Song x could be part of one list on my computer and an entirely different list on yours.

As discussed above, users can make any card or set of cards a canonical idea simply by right clicking the selection and choosing where to put it. The user creates an idea 22, realizes it is canonical, makes it canonical, and moves on with his or her work. Later, there is a place where the user can go and flexibly organize his or her canonical ideas 122 into topical collections. Significantly, the user can share an idea or a collection. Someone else can see the user's collection and think, "that collection should include my idea!" They can send it to the first user and suggest it. The shared individual idea can also be modified by the other user. The canonical ideas 122 may be perturbed based on modifications to the shared individual ideas. Topical collections become shareable products and are therefore productizable. This form of canonical gives new life to "public maps" because it communicates they are not only maps but ideas, in some cases public ideas. This methodology gets us away from maps as the object to ideas as the object.

Exemplary idea sharing methods also set up easy understanding of what to do with ideas and in particular how to use maps (which might justifiably be called idea spaces or idea canvas). For example, users may want to connect a few ideas together in the ideaspace. Users may want to take this and that idea from different places and put them into the same place. And in fact, that new set of ideas could become canonical and can be shared as its own composite idea. It creates a fractal idea sharing network—knowledge. This is particularly advantageous because it is how our language and our thinking about ideas actually works.

In addition, the sharing methodology makes the ideas and modifications also citable, which has enormous implications for knowledge and society writ large. Exemplary systems and methods make it so derivative works made up of the ideas of others are trackable, tracking changes in shared ideas or shared maps, and automatically create co-author citation networks but not for the author of a large map or paper generally, but for a single idea. It makes it so that ideas that are formed have their own history. Influence is quantified. Credit is embedded at an elemental level. It also allows for derivative forking of ideas. In other words, exemplary sharing methods create an economy of ideas. They create marketplaces where the user can search for ideas, discover ideas, trade ideas, and use ideas. A user can build a reputation as someone who has good ideas, generally or in a specific topical area (expertise). The user can build a profile based on these good ideas. Exemplary software advantageously mimics real life; it doesn't ask real life to fit into the software. It makes ideas object oriented. It makes them reified things that can be manipulated, shared, and forked.

In operation, the user may start by building a profile. User profiles are administrative, containing photo, name, email address and other identifying information. But they are also continually evolving in terms of the user's content-based mappings and the pattern of their utilization of certain structural features (DSRP). A user could build a profile that is based on not only topical expertise but also cognitive skill. This also means that exemplary embodiments can provide reports on cognitive complexity (i.e., develop metrics for one's cognitive skills) as well as topical expertise. In addition, each profile is linked to a proprietary validated indicator called STMI which provides a comprehensive view of the user's cognitive skill development.

Once the user has created an account, he or she can click on some example maps to explore what can be done—or click the "New Map" button to get started right away. Once inside a map, the can create cards—which might represent people, tasks, objects or ideas—and connect them to other cards to form diagrams, explain concepts, define processes, or brainstorm ideas. Exemplary embodiments allow the user to create visual maps 10. As discussed above, the core unit of a map is a special card called a diocard 12, which can represent people, tasks, objects, or ideas. These cards can exist on their own or be nested inside another card. A card can be connected to any other card with one or more relationship lines 26, and those relationships can be defined through a relationship card 112. A map 10 can be viewed and edited by multiple users at the same time.

The user can create diocards 12. There are different types of cards and each is created a different way. A top-level card can be created by double-clicking anywhere on the canvas of a map. When creating cards that are nested inside of other cards, hitting "Enter" will create a new card that's nested at the same level as the prior card. Clicking "Add a Part" when a card is selected will also create a new nested card. To create parts within a card, when a card is selected, the user clicks the "Add a Part" button to create a card nested inside that parent card. Additionally, hitting "Enter" when creating the title for a nested card will create a new card that's nested at the same level.

The user can collapse a card's contents and thereby hide the contents of a card (i.e., cards that are nested inside of it) by clicking the downward pointing caret ▼ on the top left corner of the card. This will hide all the contents of that card and only show the card's title. The caret will now point upwards ▲, indicating that the card is collapsed. Clicking the caret again will reveal all the contents of the card. This action purely affects how a card appears and does not change its contents. To move a card, the user moves the mouse cursor over the card until a hand icon appears. The user may click and drag the card to the area of the map he or she wishes to place it. If the card has a relationship line connecting it to another card, that line may change its shape as it moves. By dragging a card, the user can reorder it inside of a parent card, detach it from its parent, and/or drag and drop it onto another card to make it the child of that card. The grey shadow indicates where the dragged card will appear once it is released.

Cards can be deleted in two ways: by clicking on the card so it is outlined in blue and hitting the "Delete" or "Backspace" key; or by clicking the context menu on the right-hand side (three vertical dots) and selecting the trash can icon. It should be noted that deleting a card deletes any cards nested inside them as well as any relationship lines connected to them. If those relationship lines have cards on them, those cards will be deleted as well.

To create a relationship between cards, the user brings the mouse cursor to the upper-left hand corner of the origin card. In exemplary embodiments, there will be a small arrow pointing up that turns blue when the user hovers over it. Clicking and dragging that arrow from the origin card to the card the user wishes to connect to creates the relationship. In exemplary embodiments, a blue line will form to indicate the relationship. To label or define a relationship, the user double clicks on its line. In exemplary embodiments, that will create a card with a blue dot in the top left corner, which lets the user know the card is associated with the relationship line.

Relationship cards 112 have the same properties as free standing cards in that they can also have relationships, have child cards, etc. Relationship lines can be straight or curved. To adjust a relationship line 26, the user clicks on the relationship line he or she wishes to adjust and drags the line to adjust its curvature. Moving a card that is connected by a relationship line will also adjust the curve of the line. To delete a relationship line 26, the user clicks the line once, so it is highlighted in blue, then clicks the "Delete" or "Backspace" key. Deleting a relationship line will also delete the relationship card 112 on that line if there is one. Directly deleting the relationship card 112 will also delete the relationship line 26.

In the Ideas section (which can be accessed from the left-hand side of the dashboard or, when inside a map, from the menu dropdown to the left of the map title), the user can see all the cards created as well as update card titles, summaries, and include description information. Updates to any cards in the Ideas section will automatically update in any maps that use this specific card. The user can also select multiple cards at once either by holding down the "Shift" key on the keyboard and clicking on individual cards to select them, or by holding down the "Shift" key, clicking outside of a node, and dragging the mouse to select all the cards in a particular area. These methods can be combined with other actions. Cards that are selected can be moved together (via dragging), copied (via "CTRL+C" on the keyboard), or deleted (via the "Delete" key). It should be noted that only cards that have a blue outline are selected—if a card does not have a blue outline, it is not selected.

Referring again to FIGS. 3A-3D, card layout and organization will now be described. When a parent diocard 12*a* has child diocards 12*b,* 12*c,* 12*d* nested inside, there are a several layout options for how those child cards are arranged. By clicking the context menu on the top-right corner of a card, the user can change the layout of the child cards, choosing from a number of options. One is row layout, shown in FIG. 3B. This is the default option for child cards 12*b,* 12*c,* 12*d.* Cards will appear in a vertical list, with new parts being added to the bottom. Another is column layout, shown in FIG. 3C. In this mode, child cards 12*b,* 12*c,* 12*d* are laid out from left to right in a horizontal series, with new cards being added from the right. A third option is freehand layout, illustrated in FIG. 3D, in which child cards 12*b,* 12*c,* 12*d* exist in an open canvas defined by the parent card 12*a.* By moving the child cards 12*b,* 12*c,* 12*d* around, the user can expand the size of the container. This option gives the user the most flexibility in how the cards are laid out. To detach a child card in this mode, the user would select the context menu on the child card and choose "Free Part" to have the card pop out to the main background canvas. Free Part brings card to the top-level canvas no matter how many levels deep they are nested.

In exemplary embodiments, the user can add tags to any card by clicking the context menu and hitting the tag icon. Each tag may be associated with a color, which may appear as a colored "pill" at the top of the card. Hovering over a tag on a card with the mouse will reveal what that tag is. Any tag created will appear at the top left of the map in a list. There are two ways to edit tags on cards.

The user has many options for map management. To edit the name of a map, when inside of a map, clicking on the map title will allow the user to edit it. The user presses return or clicks anywhere outside of the title when finished editing the name. In exemplary embodiments, the user's' map activities are being saved automatically. Assuming the user's device is connected to the internet, the changes the user makes to his or her map are saved right away. If the device loses internet connectivity, the user will be shifted into view-only mode and will be unable to make changes until internet connectivity is re-established. This means the user doesn't have to worry about losing his or her work.

To move around and navigate the map, the user clicks and drags on a blank area of the canvas. Maps are endless virtual spaces. Reloading the page will reset a map's orientation/location. In exemplary embodiments, there are two ways to adjust a map's zoom setting. The user could use the mouse wheel or two finger touch function on most laptop touch pads to zoom in or out, or he or she could use the zoom slider in the top right-hand corner. Reloading the page will reset the map's zoom level.

As discussed above, sharing and collaboration are important features of disclosed embodiments. Maps can be shared via the dropdown menu on the right side of the map title. In exemplary embodiments, there are two links associated with each map. One is View-only—to share a link that allows other people to view a map but not edit it any way, the user clicks the first link. The other is Edit-access—to share a link that allows other people to have the same edit permissions the user does (meaning they can add cards, edit content, form relationships, and delete cards), the user clicks the second link. Multiple people can edit a map at the same time. All map links require the other user to be logged into the system to be viewed or accessed. The user can, of course, collaborate on a map with others. To edit a map in real-time with other people, the first user can have the other users load the same map using the Edit-access link. Each person's cursor will appear on the screen and the first user will all be able to interact with the map simultaneously, and everyone's changes will be reflected on screen right away.

In exemplary embodiments, there are two ways to copy a map. When inside of a map, the user goes to the dropdown menu on the right of the map title and selects "Make a copy". This will create a copy of the map the user was just editing and move the user inside of the new, copied version of the map. Alternatively, when in the dashboard, hovering over a map title will show a copy icon. Clicking the icon will create a copy of the original map. To export a map as a JSON or CSV file, the user goes to the dropdown menu on the right of the map title and selects "Export". This will take the user to a page where he or she can copy and paste the raw text in a JSON or CSV format.

In exemplary embodiments, there are two ways to delete a map. While inside a map, the user goes to the dropdown menu on the right of the map title and selects "Delete". The map will be deleted and the user will be redirected to the dashboard. Alternatively, while in the dashboard, hovering over a map title will show a trash can icon. Clicking the trash can will delete the map. It should be noted that there is currently no way to recover deleted maps (i.e. no way to recover from trash) so deleting a map is permanent.

As discussed above and illustrated FIG. 12, exemplary embodiments allow the user to create canonicals. A user can create a canonical atom (card) 112 or molecule 106 (selection of cards) by assigning it as canonical. Some definitions of canonical items are as follows. A "canonical atom" is a single diocard as canonical; these cards could have a lot of information in them such as an inventory part or concept. Exemplary embodiments provide the ability share a single card as canonical. A "canonical molecule" could include multiple atomic canonicals or individual non-canonical cards. Exemplary embodiments provide the ability to share multiple, DSRP'd cards as canonical. A user can add a canonical atom or molecule into a library or libraries (without creating multiple versions of it).

As discussed above, additional features the user can exploit include sharing. For example, an author of a canonical atom, molecule, or library can share with an individual or a group of individuals or with the public (either by sharing the canonical or library URL or specifically sharing like google). The user could also reuse a canonical. A user could choose to use a canonical atom or molecule with or without "propagation" of changes from the author. Exemplary embodiments include "forking canonicals" where a user forks a canonical, thereby retaining the connection to the original canon (propagation) but explicitly deriving from it (not propagation. A canonical could also be reused as a template: a molecular template, a map template, and/or a card template. That is, a user can choose not to "propagate" the author canonical and can therefore alter it, making it akin to a template. A "curated canonical" means a canonical where the author is a single curator and therefore has total control over what becomes a canonical. In addition, the system provides for self-organizing curation where an organization has rules, which three people must approve, for an item to become canonical.

Figure 15A:
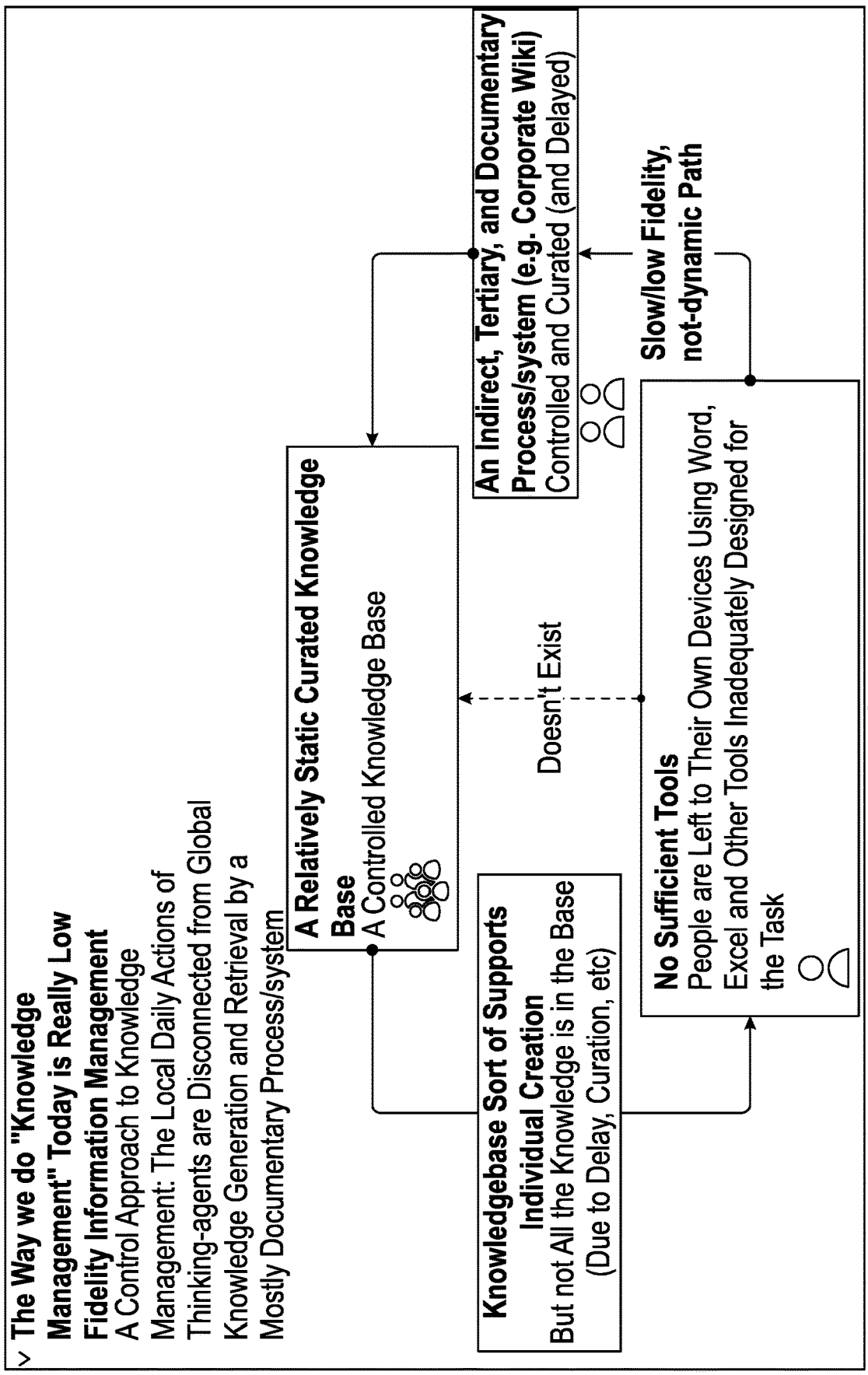
FIG. 15A is a schematic showing an existing method of knowledge management.
Figure 15B:
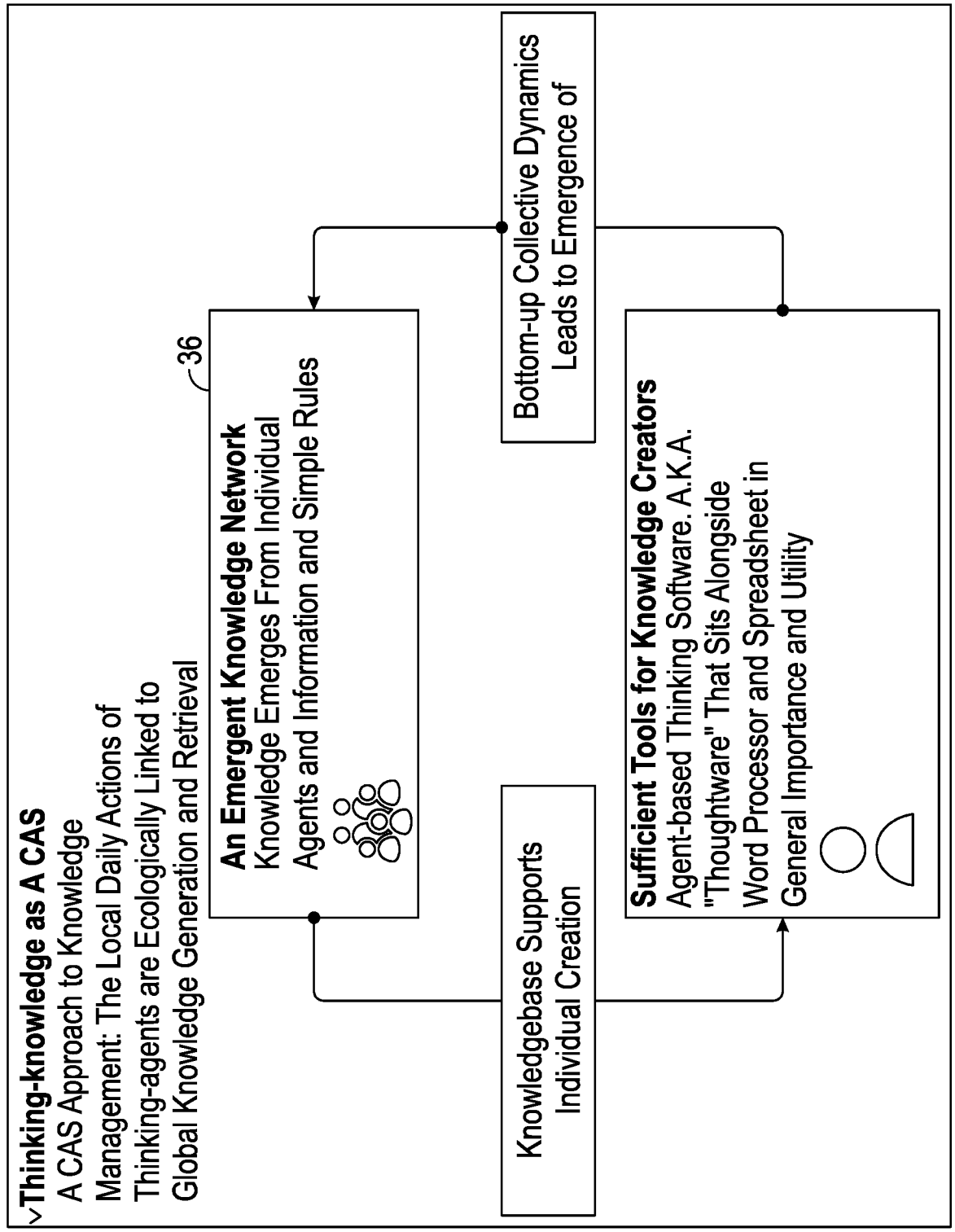
FIG. 15B is a schematic of an exemplary embodiment of knowledge management methodology in accordance with the present disclosure.

As discussed above, the act of thinking leads to the creation of knowledge. But in most cases the thinking that is being done is not "rolling up" into the knowledge that exists (in an individual or collective knowledge base). Often the act of knowledge capture is separate from the act of thinking and creation. But thinking (aka, "cognition") is not only an act itself and not only can occur prior to or post action(s), it is also inherent to action itself and therefore can and does occur during the taking of action. In exemplary embodiments, the act of thinking and solving problems advantageously directly yields the "base of knowledge" or knowledgebase 36. Referring to FIGS. 15A and 15B, this is significantly different from existing "knowledge base" activities and applications (shown in FIG. 15A) where individual thinkers need to consult the knowledge base and find a stale and curated knowledgebase rather than a fluid and up-to-date. There is also far less "load" on the system as it is operating as an efficient ecology of information and knowledge (shown in FIG. 15B), where the local individual behavior of the thinking agents leads to the collective dynamics that make knowledge an emergent property of the system itself.

It should be noted that disclosed embodiments can be valuable for training of neural networks. Exemplary maps are meaningfully different when used as input to machine learning processes, in that their semantic structure is actually explicit. Nodes have canonical references so that "Orange" the county with a reference to its Wikipedia article, for example, is unambiguously distinct from "Orange" the color with its reference to its Wikipedia article. More than that, relationships between nodes are explicitly labeled, with their labels potentially also having explicit canonical references. In this context, with much less input data we can train neural networks to produce quantitative thought vectors representing rich mental models.

These vectors can be used for many purposes, e.g., assessment in the classroom. A teacher may ask students to create maps of a situation to demonstrate their understanding. Exemplary embodiments can then derive thought vectors from each map and meaningfully quantitatively gauge their understanding by comparing to reference vectors. Another purpose could be discovering thought patterns ("jigs"). By weighting semantic structure much more heavily than content in the training process, exemplary systems can cluster derived vectors to discover common thought and reasoning patterns across subject matter.

Another purpose could be map searching. With a vector derived from each map the system can support novel ways of searching. For example, a small/simple map could be used as search input to find other maps with the same semantic content and structure, but which may be much more robust. Exemplary embodiments can use the same technique to identify similar maps to any given (potentially large) map. Cross-content searches could also be done with the software tool. With these thought vectors the system can also index other media vectors into the same space to facilitate cross-medium searches—finding books/images/video/audio that match closely with a given map, and vice versa.

Exemplary embodiments also could be used for foreign language translation. With thought vectors in place the system can train auto-encoding neural networks to generate maps from written text and written text from maps. Since maps themselves explicate semantic meaning and structure, they are a good intermediate form to facilitate foreign-language translation. In this approach, an auto-encoding model can be built for each spoken language, which can translate between maps and text in that language. Then to translate a document from e.g., English to Spanish, the system first converts the document into a map (via a thought vector) using the English model, and then converts the map back to a document (again via thought vector) using the Spanish model.

While the disclosed systems and methods have been described in terms of what are presently considered to be the most practical exemplary embodiments, it is to be understood that the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

Thus, it is seen that improved systems and methods of transforming, organizing, manipulating, and sharing information and ideas are provided. It should be understood that any of the foregoing configurations and specialized features may be interchangeably used with any of the systems of the preceding embodiments. Although illustrative embodiments are described hereinabove, it will be evident to one skilled in the art that various changes and modifications may be made therein without departing from the disclosure. It is intended in the appended claims to cover all such changes and modifications that fall within the true spirit and scope of the disclosure.

What is claimed is:

1. A hardware fractal system implemented as a visual mapping tool and transforming data, comprising:
    one or more diocards, each diocard representing an individual idea and having a group of four fractal functions consisting of a distinctions function, a systems function, a relationships function, and a perspectives function; and
    a first map comprised of the one or more diocards, the group of four fractal functions governing user interaction with respect to every diocard and at any position on the first map, at least one of the one or more diocards being a proxy for a second map comprised of at least one diocard and being expandable into the second map;
    wherein one or more diocards utilizing the distinctions function define the individual idea by attributes the individual idea is comprised of and by non-attributes the individual idea is not comprised of;
    wherein one or more diocards utilizing the systems function define the individual idea as part of a whole or a whole that can be broken into parts;
    wherein one or more diocards utilizing the relationships function define the individual idea as having a relationship with one or more different ideas and enable users to create a relational diocard representing a single relationship between one or more diocards;
    wherein one or more diocards utilizing the perspectives function define the individual idea as a point having a view with respect to one or more different ideas;

wherein the map is compressible by collapsing the one or more diocards based on one or more of: hierarchy and perspective, and a collapsed diocard can be expanded;

wherein collapsing a diocard causes surrounding diocards to automatically come closer to fill space on the map previously occupied by the collapsed diocard;

wherein expanding a diocard causes surrounding diocards to move away to make space for the expanded diocard;

wherein the system is fractal across scale such that:

at any level of scale and in any position on the map the four fractal functions govern user interaction;

each individual idea can be drawn out as a whole new system and each individual idea of the whole new system can be drawn out into another whole new system;

and a user can zoom in indefinitely to view finer details within an individual idea or diocard;

and wherein the coming closer and moving away of diocards is determined by assigning a gravity quotient to each diocard based on its area, clustering diocards into groups, and detecting and scoring user-generated diocard alignments such that when a user expands or collapses a diocard, the diocards move cluster by cluster with the heaviest diocards moving first and the heaviest diocards pulling other diocards.

2. The system of claim 1 wherein at any level of scale and in any position on the map a new distinction can be formed defining a new individual idea by attributes the new individual idea is comprised of and by non-attributes the new individual idea is not comprised of, a new system can be formed defining a new individual idea as part of a whole or a whole that can be broken into parts, a new relationship can be formed defining a new individual idea as having a relationship with one or more different ideas, and a new perspective can formed defining a new individual idea as individual idea as a point having a view with respect to one or more different ideas.

3. The system of claim 1 wherein one or more diocards utilizing the distinctions function defines a first individual idea represented by a first diocard as not being comprised of attributes of a second individual idea represented by a second diocard.

4. The system of claim 1 wherein one or more diocards utilizing the systems function enable users to break a parent diocard into one or more child diocards, the one or more child diocards being part of a whole represented by the parent diocard.

5. The system of claim 1 wherein one or more diocards utilizing the systems function enable users to group a plurality of child diocards into a group such that the plurality of diocards become parts of a whole represented by the group.

6. The system of claim 4 wherein one or more diocards utilizing the systems function enable users to create various layouts such that the one or more child diocards appear with the parent diocard.

7. The system of claim 1 wherein one or more diocards utilizing the perspectives function enable users to create a first diocard having a perspective with respect to one or more second diocards.

8. The system of claim 1 wherein the first map is scaled and nested to maintain readability, and readability is preserved when zooming out.

9. The system of claim 1 wherein the first map generates canonical suggestions in a diocard label field.

10. The system of claim 1 wherein the first map creates one or more meta-level structures for organizing the first map or the one or more diocards into at least one macro-structure.

11. The system of claim 1 wherein the first map enables generation of one or more cognitive jigs.

12. The system of claim 1 wherein the first map synthesizes behavior of users to directly yield a knowledgebase.

* * * * *